United States Patent
Nam

(10) Patent No.: US 11,598,797 B2
(45) Date of Patent: Mar. 7, 2023

(54) DUTY TIMING DETECTOR FOR DETECTING DUTY TIMING OF TOGGLE SIGNAL, DEVICE INCLUDING THE DUTY TIMING DETECTOR, AND METHOD OF OPERATING TOGGLE SIGNAL RECEIVING DEVICE

(71) Applicant: SAMSUNG ELECTRONICS CO., LTD., Suwon-si (KR)

(72) Inventor: Hyun Seok Nam, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/682,356

(22) Filed: Feb. 28, 2022

(65) Prior Publication Data
US 2022/0404410 A1   Dec. 22, 2022

(30) Foreign Application Priority Data

Jun. 18, 2021   (KR) ........................ 10-2021-0079200

(51) Int. Cl.
| | |
|---|---|
| *H03K 7/00* | (2006.01) |
| *G01R 29/027* | (2006.01) |
| *H03K 4/502* | (2006.01) |
| *H03K 5/156* | (2006.01) |
| *H02M 3/158* | (2006.01) |
| *H03K 7/08* | (2006.01) |
| *H03K 5/04* | (2006.01) |

(52) U.S. Cl.
CPC ...... *G01R 29/0273* (2013.01); *H02M 3/1582* (2013.01); *H03K 4/502* (2013.01); *H03K 5/04* (2013.01); *H03K 5/1565* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 5,770,940 A | * | 6/1998 | Goder .................. H02M 3/156 323/285 |
| 7,339,406 B2 | | 3/2008 | Takeuchi |
| 8,085,005 B2 | | 12/2011 | Dearn |

(Continued)

FOREIGN PATENT DOCUMENTS

| | | |
|---|---|---|
| KR | 10-2015-0086286 A | 7/2015 |
| KR | 10-2020-0048168 A | 5/2020 |

*Primary Examiner* — Tuan T Lam
(74) *Attorney, Agent, or Firm* — Lee IP Law, P.C.

(57) ABSTRACT

A duty timing detector includes: a control logic, the control logic being configured to: receive an input toggle signal and an output toggle signal that corresponds to the input toggle signal, and generate a difference signal using a difference between a duty of the input toggle signal and a duty of the output toggle signal; a first low-pass filter configured to output a DC input voltage based on a pulse width of the input toggle signal; a second low-pass filter configured to output a DC difference voltage based on a pulse width of the difference signal; a compensation circuit configured to compensate the duty of the output toggle signal using the DC input voltage and the DC difference voltage; and an oscillator configured to generate a duty-compensated output toggle signal, and to provide the duty-compensated output toggle signal to the control logic.

20 Claims, 19 Drawing Sheets

(56) References Cited

U.S. PATENT DOCUMENTS

| | | | |
|---|---|---|---|
| 8,248,051 B2 | 8/2012 | Colbeck et al. | |
| 8,686,801 B2* | 4/2014 | Beier | H03K 4/502 |
| | | | 323/280 |
| 8,878,509 B2 | 11/2014 | Labbe | |
| 2010/0301822 A1* | 12/2010 | Chen | H02M 3/156 |
| | | | 323/283 |
| 2013/0015830 A1* | 1/2013 | Zhang | H02M 3/1588 |
| | | | 323/282 |
| 2014/0320098 A1* | 10/2014 | Izumoto | H02M 3/156 |
| | | | 323/282 |
| 2018/0054113 A1* | 2/2018 | Kim | H02M 1/15 |

* cited by examiner

DUTY TIMING DETECTOR FOR DETECTING DUTY TIMING OF TOGGLE SIGNAL, DEVICE INCLUDING THE DUTY TIMING DETECTOR, AND METHOD OF OPERATING TOGGLE SIGNAL RECEIVING DEVICE

CROSS-REFERENCE TO RELATED APPLICATION

This application claims priority from Korean Patent Application No. 10-2021-0079200 filed on Jun. 18, 2021, in the Korean Intellectual Property Office, and all the benefits accruing therefrom under 35 U.S.C. 119, the contents of which in its entirety are herein incorporated by reference.

BACKGROUND

1. Field

Embodiments relate to a duty timing detector for detecting duty timing of a toggle signal, a device including the duty timing detector, and a method of operating a toggle signal receiving device.

2. Description of Related Art

A toggle signal repeatedly transitions from a high level to a low level. The toggle signal is widely used in electronic devices. For example, the toggle signal may act as a clock signal or a strobe signal to indicate precise timing. In another example, the toggle signal may be used to control an operation of a device receiving the toggle signal as a pulse width modulation (PWM) does.

SUMMARY

Embodiments are directed to a duty timing detector, including: a control logic, the control logic being configured to: receive an input toggle signal and an output toggle signal that corresponds to the input toggle signal, wherein the input toggle signal repeatedly transitions between a high level and a low level, and generate a difference signal using a difference between a duty of the input toggle signal and a duty of the output toggle signal; a first low-pass filter configured to output a DC input voltage based on a pulse width of the input toggle signal; a second low-pass filter configured to output a DC difference voltage based on a pulse width of the difference signal; a compensation circuit configured to compensate the duty of the output toggle signal using the DC input voltage and the DC difference voltage; and an oscillator configured to generate a duty-compensated output toggle signal, and to provide the duty-compensated output toggle signal to the control logic.

Embodiments are directed to a duty timing detector, including: a first low-pass filter configured to receive an input toggle signal and output a DC input voltage based on a pulse width of the input toggle signal, wherein the input toggle signal repeatedly transitions between a high level and a low level; a voltage divider configured to divide the DC input voltage based on a predefined ratio, and to output a DC divided voltage; a latch configured to receive the input toggle signal and an output toggle signal that corresponds to the input toggle signal, and to generate a difference signal indicating an interval between edges of the input toggle signal and the output toggle signal; a compensation circuit configured to compensate the duty of the output toggle signal, based on the DC divided voltage and the difference signal; and an oscillator configured to generate a duty-compensated output toggle signal and provide the duty-compensated output toggle signal as the output signal that is input to the latch.

Embodiments are directed to a device, including: a voltage converter configured to convert a first voltage into a second voltage using an input toggle signal, and to output the second voltage to a load, wherein the input toggle signal repeatedly transitions between a high level and a low level; and a current detector configured to detect an output toggle signal at a timing when a half of each duty of the input toggle signal has elapsed, and to detect a load current transmitted from the voltage converter to the load. The current detector may include: a control logic configured to receive the input toggle signal and the output toggle signal, and to generate a difference signal using a difference between a duty of the input toggle signal and a duty of the output toggle signal; a first low-pass filter configured to output a DC input voltage based on a pulse width of the input toggle signal; a second low-pass filter configured to output a DC difference voltage based on a pulse width of the difference signal; a compensation circuit configured to compensate a duty of the output toggle signal using the DC input voltage and the DC difference voltage; and an oscillator configured to generate a duty-compensated output toggle signal, and to provide the duty-compensated output toggle signal to the control logic.

BRIEF DESCRIPTION OF DRAWINGS

Features will become apparent to those of skill in the art by describing in detail example embodiments with reference to the attached drawings in which.

DETAILED DESCRIPTION

Figure 1:
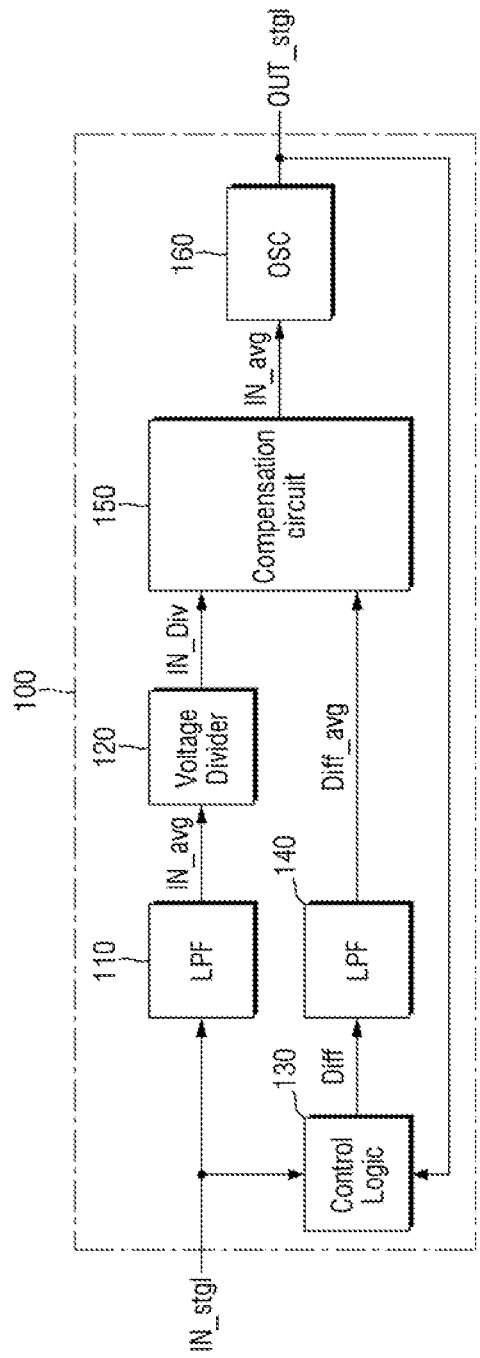
FIG. 1 is a block diagram for illustrating a duty timing detector according to some example embodiments.

In descriptions of FIG. 1 to FIG. 19, the same reference numerals are allocated to substantially the same components, and duplicate descriptions of the components are omitted. Further, throughout various drawings, like reference numerals are allocated to like elements.

Figure 2:
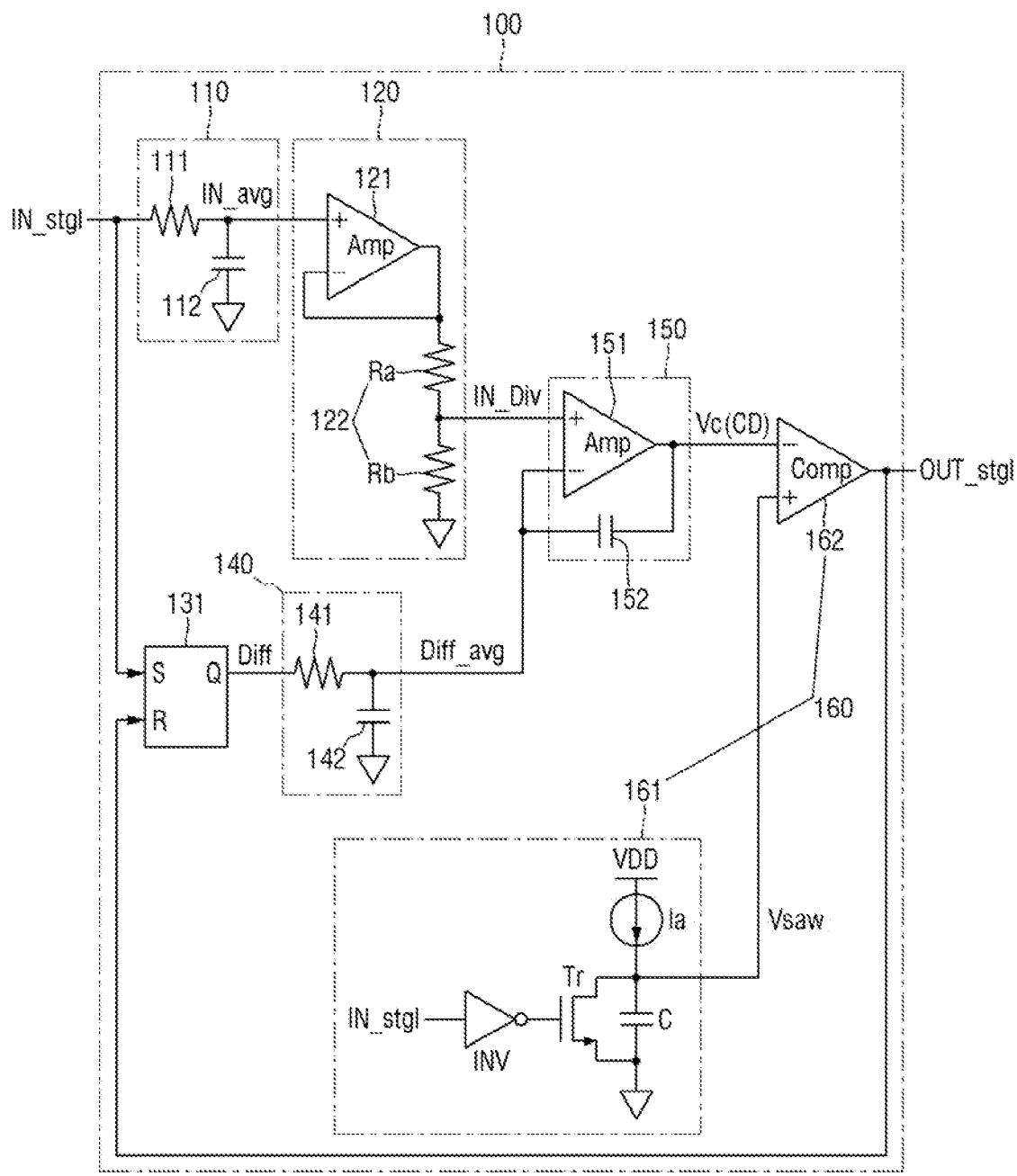
FIG. 2 is a circuit diagram for FIG. 1.

FIG. 1 is a block diagram for illustrating a duty timing detector 100 according to some example embodiments. FIG. 2 is a circuit diagram for FIG. 1.

The duty timing detector 100 may detect a specific timing (for example, a target timing) on a duty in a toggle signal that repeatedly transitions to between a high level and a low level. The duty may indicate a period in which the toggle signal has a high level (or a low level). The duty ratio may indicate a ratio of a period of a high level (or a low level) of the toggle signal to a period of one cycle of the toggle signal.

The duty timing detector 100 may include a first low-pass filter 110, a voltage divider 120, a control logic 130, a second low-pass filter 140, a compensation circuit 150, and an oscillator 160.

The duty timing detector may receive an input toggle signal IN_stgl, and outputs an output toggle signal OUT_stgl. The duty timing detector 100 may detect a specific timing (for example, a target timing) on a duty in the input toggle signal IN_stgl.

The first low-pass filter 110 may receive the input toggle signal IN_stgl as a toggle signal. The first low-pass filter 110 and may output a DC input voltage IN_avg as an average voltage of the input toggle signal IN_stgl, and provide the DC input voltage IN_avg to the voltage divider 120.

The DC input voltage IN_avg includes a DC component having a constant voltage magnitude and is free of an AC component. The magnitude of the DC input voltage IN_avg is determined based on a duty length (pulse width) of the input toggle signal IN_stgl.

The first low-pass filter 110 may include a first resistor 111 and a first capacitor 112. The first resistor 111 and the first capacitor 112 constitute an RC primary low-pass filter. A resistance value of the first resistor 111 may be in a range of 10 MΩ to 30 MΩ, and a capacitance of the first capacitor 112 may be in a range of 10 pF to 1 nF.

The voltage divider 120 may receive the DC input voltage IN_avg, divide the DC input voltage IN_avg according to a predefined ratio, output a DC divided voltage IN_Div, and provide the DC divided voltage IN_Div to the compensation circuit 150.

The DC divided voltage IN_Div includes a DC component having a constant voltage magnitude, and is free of an AC component. The magnitude of the DC divided voltage IN_Div may be determined based on a predefined ratio. The predefined ratio is determined based on a ratio of divided resistors 122 to be described below.

The voltage divider 120 may include a first amplifier 121 and the divided resistors 122.

The first amplifier 121 may maintain the received DC input voltage IN_avg, and provide the DC input voltage IN_avg to the divided resistors 122.

The divided resistors 122 may include an a-th resistor Ra and a b-th resistor Rb. The a-th resistor Ra and the b-th resistor Rb may be connected in series with each other, and disposed between and connected to a connection node with the first amplifier 121 and a ground node. The DC divided voltage IN_Div may be generated at a node between the a-th resistor Ra and the b-th resistor Rb. Therefore, the predefined ratio is defined as the following Equation 1:

$$\alpha = Rb/(Ra+Rb) \qquad \text{Equation 1}$$

In the Equation 1, $\alpha$ denotes the predefined ratio, Ra denotes a resistance value of the first resistor Ra, and Rb denotes a resistance value of the second resistor Rb.

The DC divided voltage IN_Div according to some example embodiments is equal to $Rb/(Ra+Rb) \cdot IN\_avg$.

The control logic 130 may also receive the input toggle signal IN_stgl, and may receive the output toggle signal OUT_stgl of the duty timing detector 100 relative to the input toggle signal IN_stgl. The control logic 130 may use a difference between duties of the input toggle signal IN_stgl and the output toggle signal OUT_stgl to generate a difference signal Diff between the input toggle signal IN_stgl and the output toggle signal OUT_stgl, and then provide the difference signal Diff to the second low-pass filter 140.

In an implementation, the control logic 130 includes a SR latch 131 that receives the input toggle signal IN_stgl and the output toggle signal OUT_stgl, and outputs the difference signal Diff having a duty as an interval between rising edges of the input toggle signal IN_stgl and the output toggle signal OUT_stgl. In an implementation, the control logic 130 may include a J-K latch.

The SR latch 131 may receive the input toggle signal IN_stgl through a set node S thereof, and receive the toggle signal OUT_stgl through a reset node R thereof. For the case in which a duty of the output toggle signal OUT_stgl is obtained by dividing a duty of the input toggle signal IN_stgl, an output Q of the SR latch 131 may have a high level at a rising edge of the input toggle signal IN_stgl. Subsequently, the output Q may have a limit input at a rising edge of the output toggle signal OUT_stgl, and may be inverted to a low level. Thereafter, when the input toggle signal IN_stgl and the output toggle signal OUT_stgl drop, the output Q is maintained.

The second low-pass filter 140 may receive the difference signal Diff from the output Q of the SR latch 131 as a toggle signal. The second low-pass filter 140 may output a DC difference voltage Diff_avg as an average voltage of the difference signal Diff, and provide the DC difference voltage Diff_avg to the compensation circuit 150.

The DC difference voltage Diff_avg includes a DC component having a constant voltage magnitude, and is free of an AC component. The magnitude of the DC difference voltage Diff_avg is determined based on a duty length (pulse width) of the difference signal Diff.

The second low-pass filter 140 may include a second resistor 141 and a second capacitor 142, which constitute an RC primary low-pass filter. A resistance value of the second resistor 141 may be in a range of 10 MΩ to 30 MΩ, and a capacitance of the second capacitor 142 may be in a range of 10 pF to 1 nF.

The compensation circuit 150 may compare the magnitudes of the DC divided voltage IN_Div with the DC difference voltage Diff_avg (as inputs). The compensation circuit 150 may output a compensation voltage Vc as compensation data CD based on the comparing result, and provide the compensation voltage Vc to the oscillator 160. The compensation circuit 150 may compensate for a duty of the output toggle signal OUT_stgl of the duty timing detector 100.

As described below, the compensation circuit 150 receives the DC divided voltage IN_Div and performs compensation operation based on the DC divided voltage IN_Div, and thus performs the compensation operation based on the predefined ratio of the voltage divider 120.

The compensation circuit 150 may include a second amplifier 151 and an integration capacitor 152. The second amplifier 151 and the integration capacitor 152 constitute an OP amplifier circuit in a form of an inverting integrator. The DC divided voltage IN_Div may be input to a positive node (+) of the second amplifier 151, and the DC difference voltage Diff_avg may be input to a negative node (−) of the second amplifier 151.

Therefore, when a magnitude of the DC difference voltage Diff_avg is greater than a magnitude of the DC divided voltage IN_Div, the compensation voltage Vc as an output of the compensation circuit 150 decreases. Conversely, when the magnitude of the DC difference voltage Diff_avg is smaller than the magnitude of the DC divided voltage IN_Div, the compensation voltage Vc as the output of the compensation circuit 150 increases. When the magnitude of the DC difference voltage Diff_avg is equal to the magnitude of the DC divided voltage IN_Div, a magnitude of the compensation voltage Vc is maintained.

The oscillator 160 may receive the compensation voltage Vc as the compensation data CD. The oscillator 160 may generate a duty-compensated output toggle signal OUT_stgl based on the compensation voltage Vc, and provide the duty-compensated output toggle signal OUT_stgl to the control logic 130. Therefore, the control logic 130—the second low-pass filter 140—the compensation circuit 150—the oscillator 160 constitute one feedback closed circuit.

The oscillator 160 may include a sawtooth-wave voltage generator 161 and a comparator 162. The sawtooth-wave voltage generator 161 may receive the input toggle signal IN_stgl, and may output a sawtooth-wave voltage Vsaw in synchronization with the input toggle signal IN_stgl. The comparator 162 may compare magnitudes of the sawtooth-wave voltage Vsaw and the compensation voltage Vc with each other (as inputs), and output the output toggle signal OUT_stgl based on the comparing result.

The sawtooth-wave voltage generator 161 may include a current source Ia, a capacitor C, a discharge transistor Tr, and an inverter INV. The current source Ia may be connected to and disposed between a power node (to which a power voltage VDD is supplied) and an output node (from which the sawtooth-wave voltage Vsaw is output). The current source Ia may output a constant current toward the output node. The capacitor C may be connected to and disposed between the output node and a ground node (to which the ground voltage VSS is supplied). The capacitor C may be charged using current output from the current source Ia, and thus generate a sawtooth period for which a level of the sawtooth-wave voltage Vsaw continuously rises up.

The discharge transistor Tr may be connected to and disposed between the output node and the ground node. The discharge transistor Tr may operate in response to the input toggle signal IN_stgl as inverted by the inverter INV. The discharge transistor Tr may be embodied as an NMOS transistor that is turned on when the input toggle signal IN_stgl has a low level. The input toggle signal IN_stgl may cause the voltage charged to the capacitor C to be discharged, thereby generating an idle period for which the level of the sawtooth-wave voltage Vsaw is a ground level.

The comparator 162 may receive the compensation voltage Vc at a negative node (−) thereof, and may receive the sawtooth-wave voltage Vsaw at a positive node (+) thereof.

The comparator 162 may output a low level output toggle signal OUT_stgl when the sawtooth-wave voltage Vsaw is lower than the compensation voltage Vc. The comparator 162 may output a high level output toggle signal OUT_stgl when the sawtooth-wave voltage Vsaw is equal to or higher than the compensation voltage Vc.

When the compensation voltage Vc maintains a constant value, the output toggle signal OUT_stgl may indicate that a timing on a duty of the input toggle signal IN_stgl has reached a target timing. The target timing may be determined based on the predefined ratio of the voltage divider 120. Further, the output toggle signal OUT_stgl may have a duty obtained by dividing a duty of the input toggle signal IN_stgl by the predefined ratio of the voltage divider 120.

The duty timing detector 100 according to an example embodiment may detect the target timing on the duty of the input toggle signal IN_stgl. Therefore, the detector 100 may serve to verify whether the input toggle signal IN_stgl is normally generated. Further, the duty timing detector 100 may generate the output toggle signal OUT_stgl having a duty obtained by dividing the duty of the input toggle signal IN_stgl. A duty division function of the duty timing detector 100 may be usefully used in various fields.

Figure 3:
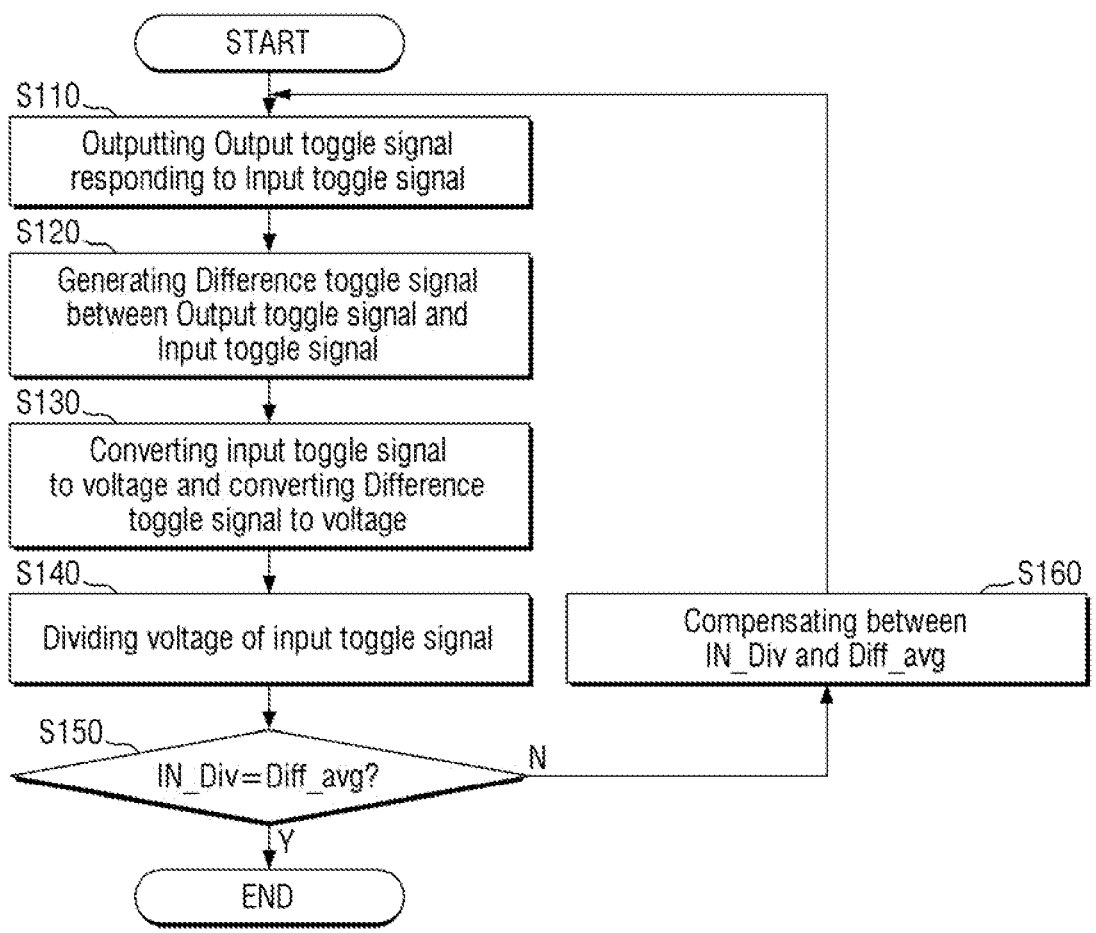
FIG. 3 is a flowchart for illustrating a method of operating a duty timing detector according to some example embodiments.
Figure 4:
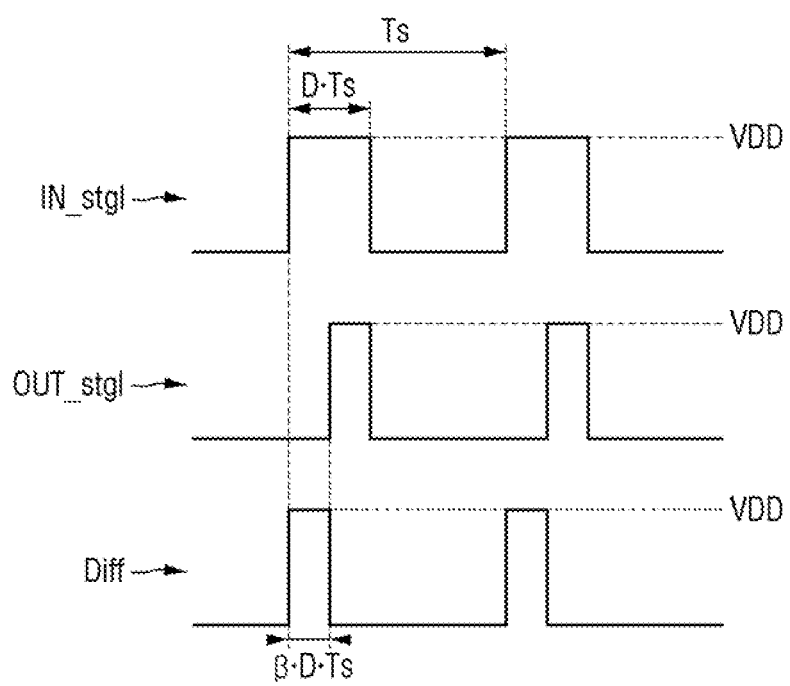
FIG. 4 to FIG. 6 are timing diagrams of signals for illustrating an operation of a duty timing detector according to some example embodiments.
Figure 5:
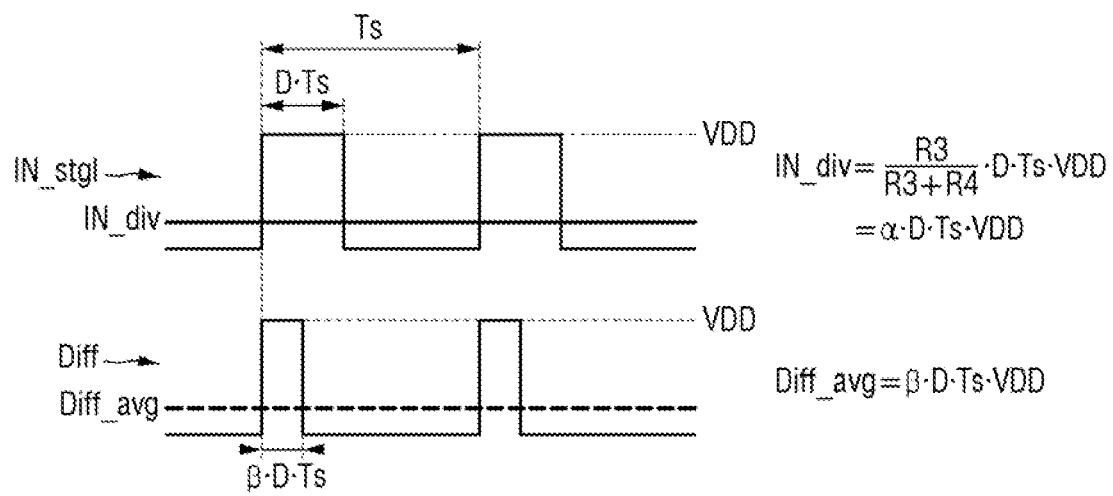
Figure 6:
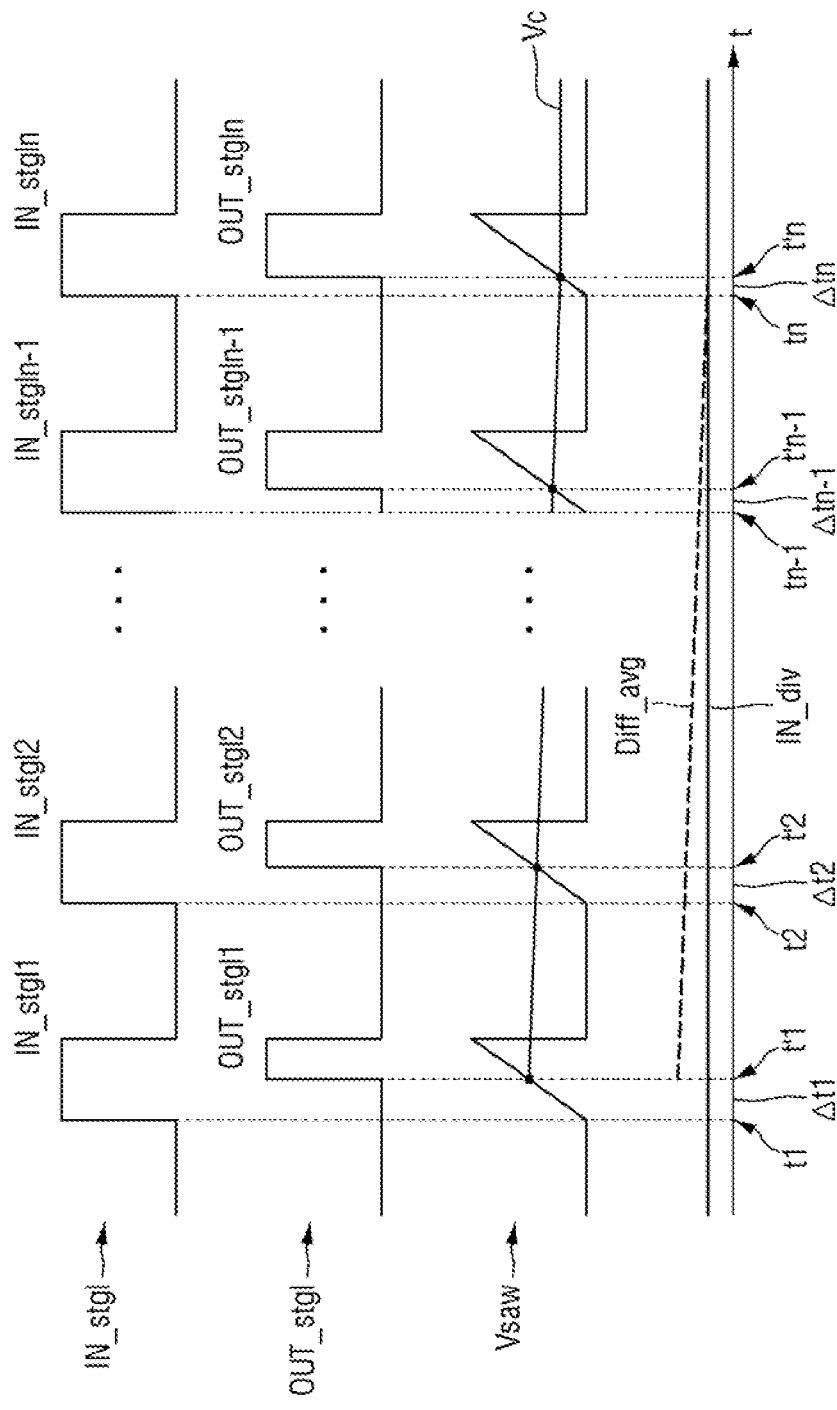

FIG. 3 is a flowchart for illustrating a method of operating the duty timing detector 100 according to some example embodiments. FIG. 4 to FIG. 6 are timing diagrams of signals for illustrating an operation of the duty timing detector 100 according to some example embodiments.

Referring to FIG. 3 and FIG. 4, the duty timing detector 100 outputs the output toggle signal OUT_stgl having a duty obtained by dividing a duty of the input toggle signal IN_stgl in operation S110.

The input toggle signal IN_stgl has a high level VDD for a period in which a duty ratio D is applied to a signal period Ts. The output toggle signal OUT_stgl has a high level VDD period obtained by dividing the duty of the input toggle signal IN_stgl by a (1−β) ratio. β is a ratio between duty ratios of the difference signal Diff and the input toggle signal IN_stgl to which the duty of the difference signal Diff which will be described below is to be applied.

The control logic 130 receives the input toggle signal IN_stgl and the output toggle signal OUT_stgl, and generates the difference signal Diff having a duty of a high level VDD that corresponds to a period between a rising edge of the input toggle signal IN_stgl and a rising edge of the output toggle signal OUT_stgl in operation S120.

Therefore, the difference signal Diff has a duty for β·D·Ts from the rising edge of the input toggle signal IN_stgl.

Referring additionally to FIG. 5, the first low-pass filter 110 may convert the input toggle signal IN_stgl to the DC input voltage IN_avg (which the voltage divider 120 divides to generate a DC divided voltage IN_div). The second low-pass filter 140 converts the difference signal Diff into DC difference voltage Diff_avg in operation S130.

The DC input voltage IN_avg includes a DC voltage component and is free of an AC voltage component. A magnitude of the DC input voltage IN_avg is the same as that of an average voltage of the input toggle signal IN_stgl.

The DC difference voltage Diff_avg includes a DC voltage component and is free of an AC voltage component. A magnitude of the DC difference voltage Diff_avg is the same as that of an average voltage of the difference signal Diff, and is defined as the following Equation 2:

$$\text{Diff\_avg} = \beta \cdot D \cdot T_S \cdot \text{VDD} \qquad \text{Equation 2}$$

In the Equation 2, β is a ratio between the duty ratios of the difference signal Diff and the input toggle signal IN_stgl, D is a duty ratio of the input toggle signal IN_stgl, Ts is the signal period Ts of the input toggle signal IN_stgl, and VDD is a voltage magnitude of a high level of the input toggle signal IN_stgl.

The voltage divider 120 divides the DC input voltage IN_avg to generate the DC divided voltage IN_div in operation S140.

The DC divided voltage IN_div includes a DC voltage component and is free of an AC voltage component. A magnitude of the DC divided voltage IN_div is the same as a value obtained by applying a predefined ratio $\alpha$ to the average voltage of the input toggle signal IN_stgl, and is defined as the following Equation 3:

$$\text{IN\_div} = \alpha \cdot D \cdot T_S \cdot \text{VDD} = Rb/(Ra+Rb) \cdot D \cdot T_S \cdot \text{VDD} \qquad \text{Equation 3}$$

In the Equation 3, $\alpha$ is the predefined ratio of the Equation 1, D is the duty ratio of the input toggle signal IN_stgl, Ts is the signal period Ts of the input toggle signal IN_stgl, and the VDD is the voltage magnitude of a high level of the input toggle signal IN_stgl.

Referring additionally to FIG. 6, the compensation circuit 150 compares whether magnitudes of the DC divided voltage IN_div and the DC difference voltage Diff_avg are equal to each other in operation S150.

A difference between the magnitudes of the DC divided voltage IN_div and the DC difference voltage Diff_avg is due to a difference between the predefined ratio $\alpha$ of the Equation 1 and the ratio $\beta$ between the duty ratio of the difference signal Diff of the Equation 2 and the duty ratio of the input toggle signal IN_stgl. Thus, the compensation circuit 150 may perform the operation S150 by comparing the ratios $\alpha$ and $\beta$ with each other.

When the magnitudes thereof are not equal to each other (No in operation S150), the compensation circuit 150 outputs the compensation voltage Vc for the DC divided voltage IN_div and the DC difference voltage Diff_avg to perform a compensation operation in operation S160.

Referring to FIG. 6, the input toggle signal IN_stgl includes first to n-th input toggle signals IN_stgl1 to IN_stgln which occur sequentially. Each of the first to n-th input toggle signals IN_stgl1 to IN_stgln corresponds to one pulse signal. The output toggle signal OUT_stgl includes first to n-th output toggle signals OUT_stgl1 to OUT_stgln that correspond to the first to n-th input toggle signals IN_stgl1 to IN_stgln, respectively.

In FIG. 6, a magnitude of the DC difference voltage Diff_avg (which corresponds to a first difference period $\Delta t1$ between a first input rising edge time-point t1 of the first input toggle signal IN_stgl1 and a first output rising edge time-point of the first output toggle signal OUT_stgl1) is greater than that of the DC divided voltage IN_div. Therefore, as in the above description of the compensation circuit 150, the compensation circuit 150 acts as an inversion integrator to decrease the compensation voltage Vc to perform the compensation operation for the DC divided voltage IN_div and the DC difference voltage Diff_avg.

As the compensation voltage Vc decreases, a subsequent second output rising edge time-point t'2 occurs earlier, so that a second difference period $\Delta t2$ may be narrowed to narrow a gap between the DC difference voltage Diff_avg and the DC divided voltage IN_div.

Thereafter, the duty timing detector 100 may repeatedly perform the operations S110 to S160. It will be understood that the description of the first input toggle signal IN_stgl1 and the first output toggle signal OUT_stgl1 with reference to FIG. 6 is applied to second to (n−1)-th input toggle signals IN_stgl2 to IN_stgln−1 and second to (n−1)-th output toggle signals OUT_stgl2 to OUT_stgln−1.

A magnitude of a DC difference voltage Diff_avg (which corresponds to a n-th difference period $\Delta tn$ between a n-th input rising edge time-point tn of the n-th input toggle signal IN_stgln and a n-th output rising edge time-point t'n of the n-th output toggle signal OUT_stgln) is equal to that of the DC divided voltage IN_div. Therefore, after outputting the n-th input toggle signal IN_stgln and the n-th output toggle signal OUT_stgln, the duty timing detector 100 detects the target timing using the output toggle signal OUT_stgl without performing the compensation operation of the compensation circuit 150.

Figure 7:
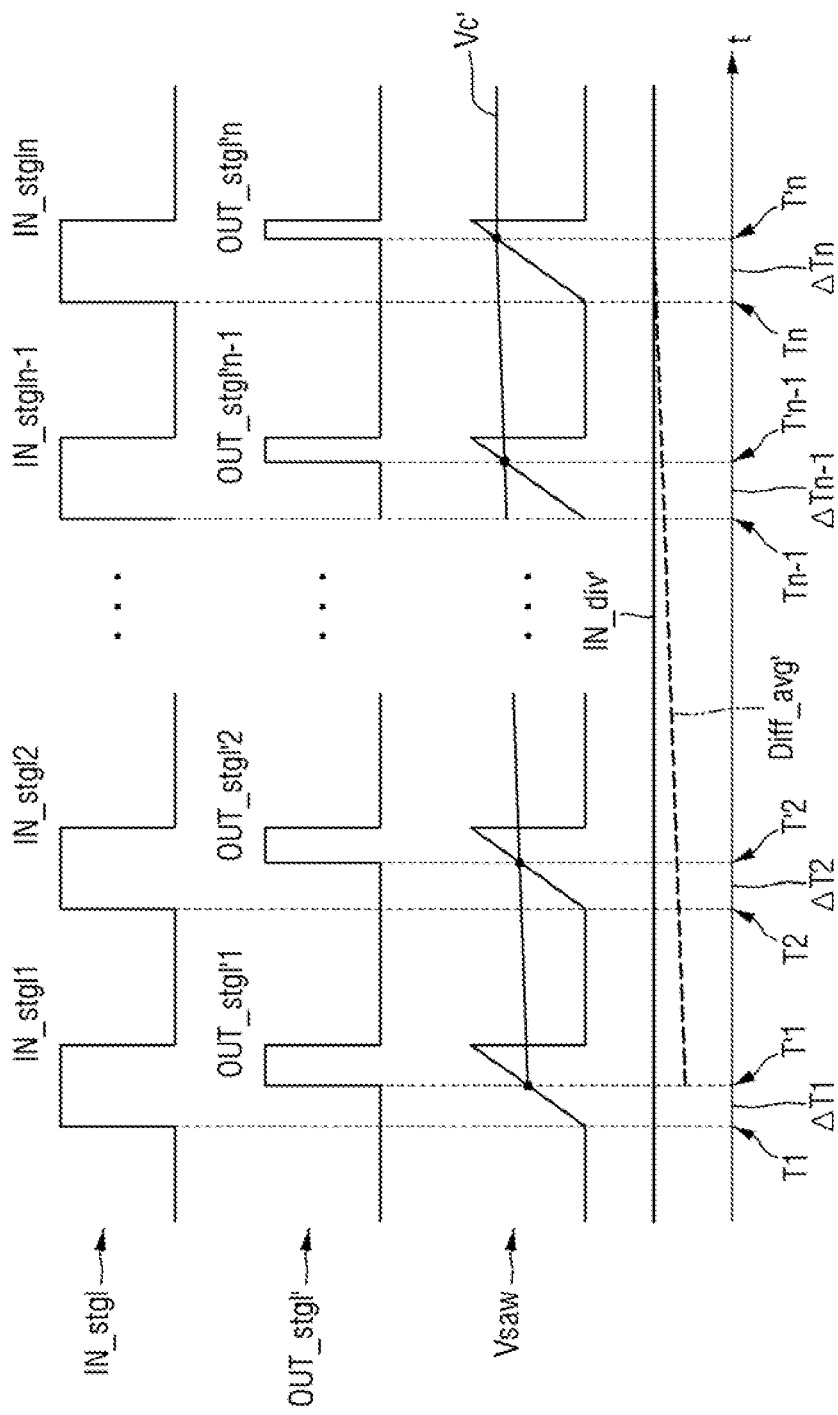
FIG. 7 is a timing diagram of signals for illustrating another operation of a duty timing detector according to some example embodiments.

FIG. 7 is a timing diagram of signals for illustrating another operation of a duty timing detector according to some example embodiments. For convenience of description, descriptions referring to FIG. 7 are focused on differences thereof from those described referring to FIG. 6.

Referring to FIG. 7, an output toggle signal OUT_stgl' includes first to n-th output toggle signals OUT_stgl'1 to OUT_stgl'n that correspond to the first to n-th input toggle signals IN_stgl1 to IN_stgln, respectively.

In FIG. 7, a magnitude of a DC difference voltage Diff_avg' corresponding to a first difference period $\Delta T1$ between a first input rising edge time-point T1 of the first input toggle signal IN_stgl1 and a first output rising edge time-point T'1 of the first output toggle signal OUT_stgl'1 is smaller than that of the DC divided voltage IN_div'. Therefore, as in the above description of the compensation circuit 150, the compensation circuit 150 acts as an inversion integrator to increase the compensation voltage Vc to perform the compensation operation for the DC divided voltage IN_div' and the DC difference voltage Diff_avg'.

As the compensation voltage Vc increases, a subsequent second output rising edge time-point T'2 is delayed, so that a second difference period $\Delta T2$ may be narrowed to narrow a gap between the DC difference voltage Diff_avg' and the DC divided voltage IN_div'.

Thereafter, the duty timing detector 100 may repeatedly perform the operations S110 to S160. It will be understood that the above description of the first input toggle signal IN_stgl1 and the first output toggle signal OUT_stgl'1 is applied to second to (n−1)-th input toggle signals IN_stgl2 to IN_stgln−1 and second to (n−1)-th output toggle signals OUT_stgl'2 to OUT_stgl'n−1.

A magnitude of a DC difference voltage Diff_avg' corresponding to a n-th difference period $\Delta Tn$ between a n-th input rising edge time-point Tn of the n-th input toggle signal IN_stgln and a n-th output rising edge time-point T'n of the n-th output toggle signal OUT_stgl'n is equal to that of the DC divided voltage IN_div'. Therefore, after outputting the n-th input toggle signal IN_stgln and the n-th output toggle signal OUT_stgl'n, the duty timing detector 100 detects the target timing using the output toggle signal OUT_stgl' without performing the compensation operation of the compensation circuit 150.

The duty timing detector 100 according to some example embodiments may detect the duty timing based on the ratio of the resistors as analog elements, so that detectable resolution may be non-limited. In addition, the duty timing detector 100 may detect the duty timing using a feedback structure to accurately detect the target duty timing.

Figure 8:
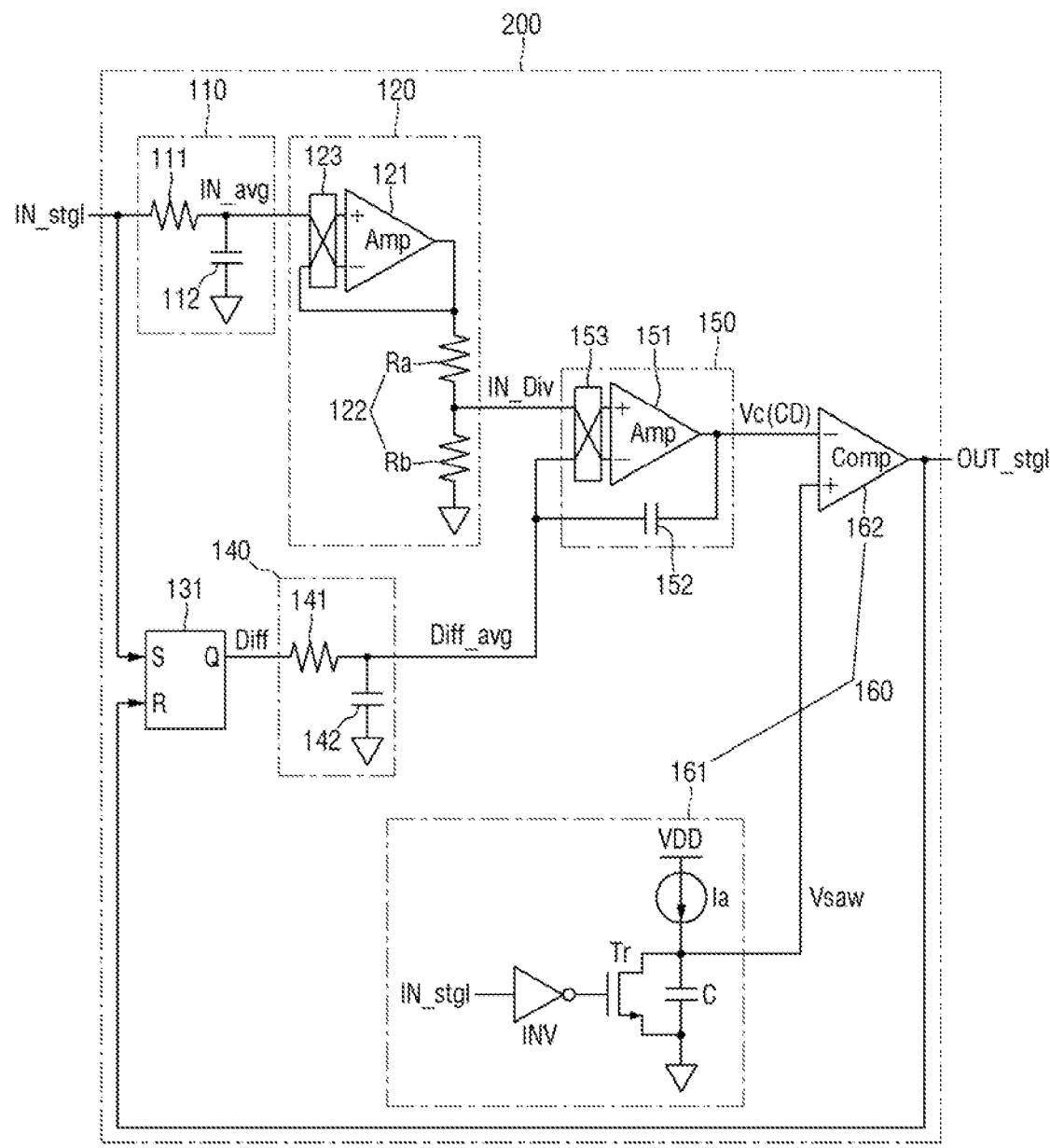
FIG. 8 and FIG. 9 are diagrams for illustrating a duty timing detector according to some example embodiments.
Figure 9:
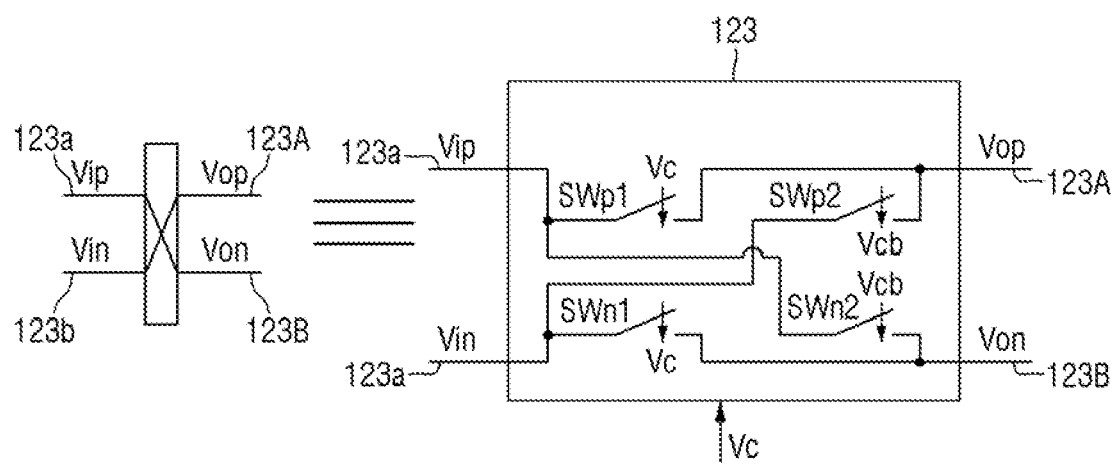

FIG. 8 and FIG. 9 are diagrams for illustrating a duty timing detector 200 according to some example embodiments. For convenience of description, the description referring to FIG. 8 and FIG. 9 is focused on differences thereof from those described referring to FIG. 2.

The voltage divider 120 of the duty timing detector 200 may further include a first chopper 123 disposed at an input front end of the first amplifier 121. The compensation circuit 150 of the duty timing detector 200 further includes a second chopper 153 disposed at an input front end of the second amplifier 151.

The first chopper 123 connects input ports 123a and 123b to output ports 123A and 123B based on a control voltage Vc. The output ports 123A and 123B are respectively connected to a positive node (+) and a negative node (−) of the first amplifier. The first chopper 123 includes a first switch SWp1, a second switch SWn2, a third switch SWn2, and a fourth switch SWp2 that operate based on the control voltage.

The first switch SWp1, the second switch SWn2, the third switch SWn2, and the fourth switch SWp2 may be turned on when the control voltage is logically '1', and may be turned off when the control voltage is logically '0'. In the drawing, a voltage Vcb controlling the third switch SWn2 and the fourth switch SWp2 is a voltage obtained by logically inverting the control voltage Vc.

When the control voltage Vc is logically '1', the first switch SWp1, and the second switch SWn2 are turned on, while the third switch SWn2 and the fourth switch SWp2 are turned OFF by the voltage Vcb. In this case, the first input port 123a is connected to the first output port 123A, while the second input port 123b is connected to the second output port 123B. A state in which the first input port 123a and the first output port 123A are connected to each other and the second input port 123b and the second output port 123B are connected to each other may be referred to as a first state. In the first state, Vip=Vop, and Vin=Von.

On the other hand, when the control voltage Vc is logically '0', the first switch SWp1 and the second switch SWn2 is turned off, while the third switch SWn2 and the fourth switch SWp2 are turned on by the voltage Vcb. In this case, the first input port 123a is connected to the second output port 123B, while the second input port 123b is connected to the first output port 123A. A state in which the first input port 123a and the second output port 123B are connected to each other and the second input port 123b and the first output port 123A are connected to each other may be referred to as a second state. In the second state, Vip=Von, and Vin=Vop.

The voltage divider 120 according to some example embodiments may reduce a drift offset (e.g., due to deterioration of the amplifier, etc.) via control of the control voltage Vc for the first chopper 123, thereby improving accuracy in detecting the duty timing.

The second chopper 153 of the compensation circuit 150 also has the same configuration as that of the first chopper 123. Thus, it will be understood that description of the second chopper 153 and the second amplifier 151 is replaced with the above description of the first chopper 123 and the first amplifier 121.

In a similar manner as in the first chopper 123, the voltage divider 120 according to some example embodiments may reduce a drift offset due to deterioration of the amplifier, etc. via control of a control voltage for the second chopper 153, thereby improving accuracy in detecting the duty timing.

In following descriptions of FIG. 10 to FIG. 19, the output toggle signal OUT_stgl has been subjected to the operation S110 to operation S160 of FIG. 3, and is referred to as a detected voltage Vdet.

Figure 10:
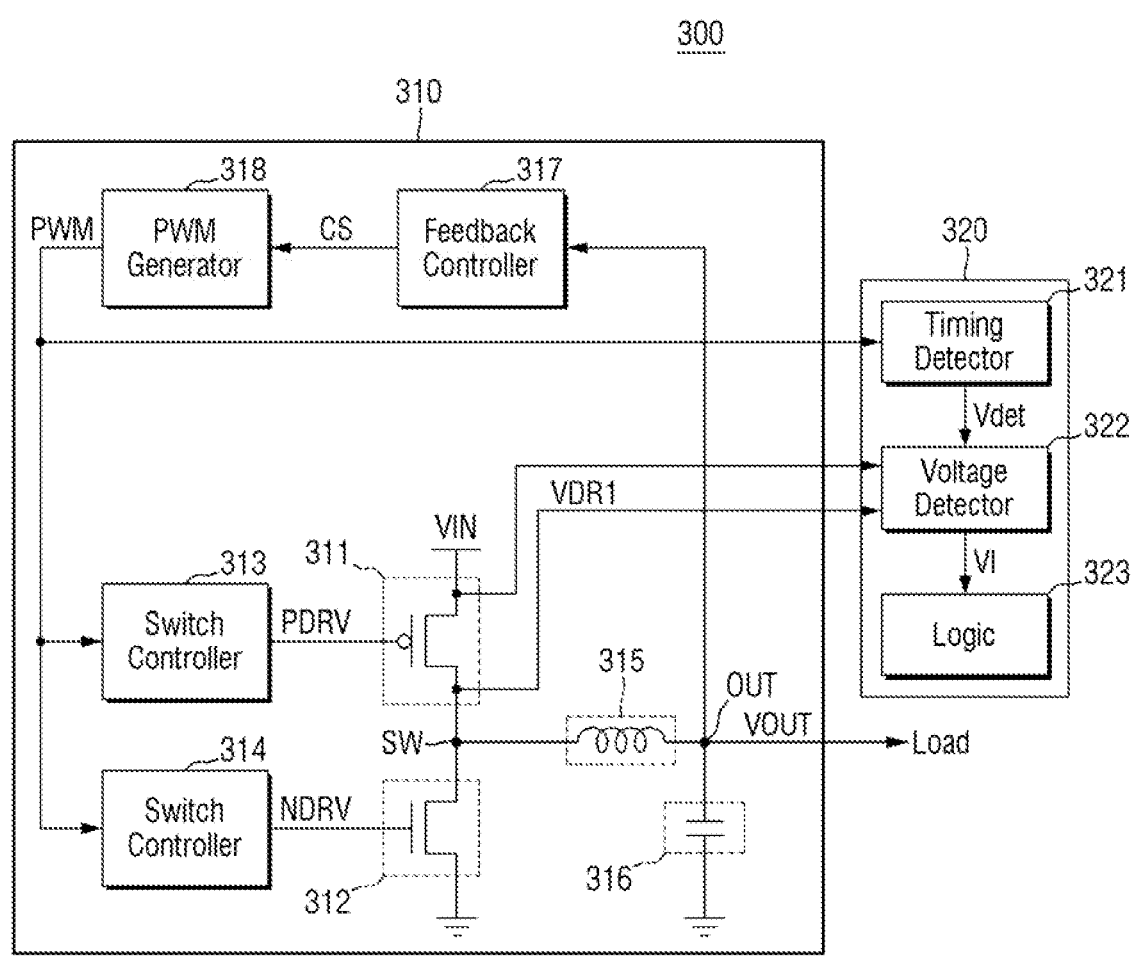
FIG. 10 is a diagram for illustrating a device according to some example embodiments.

FIG. 10 is a diagram for illustrating a device 300 according to some example embodiments.

The device 300 may act as, e.g., a power management device or a power management integrated circuit (PMIC).

Referring to FIG. 10, the device 300 may include a voltage converter 310 and a current detector 320.

The voltage converter 310 may be embodied as a DC-DC converter. Further, the voltage converter 310 may be embodied as a buck converter that generates an output voltage VOUT that is lower than an input voltage VIN.

The voltage converter 310 may include a first switch 311, a second switch 312, a first switch controller 313, a second switch controller 314, a first charging element 315, a second charging element 316, a feedback controller 317, and a pulse width modulation (PWM) signal generator 318 that generates a pulse width modulation signal PWM.

The first switch 311 may be connected to and disposed between an input node (to which the input voltage VIN is supplied) and a switch node SW. The first switch 311 may operate in response to a first control signal PDRV output from the first switch controller 313. The first switch 311 may be embodied as a PMOS transistor.

The second switch 312 may be connected to and disposed between the switch node SW and a ground node. The second switch 312 may operate in response to a second control signal NDRV output from the second switch controller 314. The second switch 312 may be embodied as an NMOS transistor.

The first switch controller 313 is configured to control the first switch 311. The first switch controller 313 may activate and deactivate the first control signal PDRV in response to the pulse width modulation signal PWM. For example, the first switch controller 313 may receive a voltage of the switch node SW or the second control signal NDRV, and may control the first control signal PDRV based on at least two signals among the pulse width modulation signal PWM, the voltage of the switch node SW, and the second control signal NDRV.

The second switch controller 314 is configured to control the second switch 312. The second switch controller 314 may activate and deactivate the second control signal NDRV in response to the pulse width modulation signal PWM. For example, the second switch controller 314 may receive the voltage of the switch node SW or the first control signal PDRV, and may control the second control signal NDRV based on at least two signals among the pulse width modulation signal PWM, the voltage of the switch node SW, and the first control signal PDRV.

The first switch controller 313 and the second switch controller 314 may control the first control signal PDRV and the second control signal NDRV in a complementary manner. When the first control signal PDRV or the second control signal NDRV transitions, the first switch controller 313 and the second switch controller 314 may provide a dead time for which both the first control signal PDRV and the second control signal NDRV are deactivated.

The first charging element 315 may be connected to and disposed between the switch node SW and an output node OUT (from which an output voltage VOUT is output). The first charging element 315 may be embodied as an inductor.

The second charging element 316 may be connected to and disposed between the output node OUT and the ground node. The second charging element 316 may be embodied as a capacitor.

The feedback controller 317 may detect a level of the output voltage VOUT. The feedback controller 317 may output a control signal CS varying based on whether the level of the output voltage VOUT is higher or lower than a target voltage. When the level of the output voltage VOUT is higher than the target voltage, the feedback controller 317 may output the control signal CS so that the output voltage VOUT is lowered down. When the level of the output voltage VOUT is lower than the target voltage, the feedback controller 317 may output the control signal CS so that the output voltage VOUT is raised up.

The pulse width modulation signal generator 318 may generate the pulse width modulation signal PWM in response to the control signal CS. For example, when the control signal CS indicates that the output voltage VOUT should be raised up, the pulse width modulation signal generator 318 may decrease (or increase) a pulse width of the pulse width modulation signal PWM. When the control signal CS indicates that the output voltage VOUT should be lowered down, the pulse width modulation signal generator 318 may increase (or decrease) a pulse width of the pulse width modulation signal PWM.

The current detector 320 may detect a current output from the voltage converter 310 to a load.

The current detector 320 may include a timing detector 321, a voltage detector 322, and a logic 323.

The timing detector 321 may receive the pulse width modulation signal PWM from the voltage converter 310. The timing detector 321 may detect a specific timing from a duty of the pulse width modulation signal PWM of the voltage converter 310. The timing detector 321 may include the duty timing detector 100 as described above with reference to FIG. 1 to FIG. 9. The specific timing may be determined based on a ratio of the resistance values of the a-th resistor Ra and the b-th resistor Rb of the voltage divider 120.

The timing detector 321 may transition a level of the detected voltage Vdet from a low level to a high level as described above with reference to FIG. 6 and FIG. 7 when the specific timing is detected. When the duty of the pulse width modulation signal PWM has elapsed, the timing detector 321 may transition a level of the detected voltage Vdet from a high level to a low level. The detected voltage Vdet may not only indicate the specific timing, but may also have a duty obtained by dividing the duty of the pulse width modulation signal PWM.

The voltage detector 322 may detect a first voltage drop VDR1 inside the voltage converter 310 in response to the detected voltage Vdet. For example, the voltage detector 322 may detect the first voltage drop VDR1 at a specific timing, e.g., at a timing when a level of the detected voltage Vdet transitions from a low level to a high level. The voltage detector 322 may function as a voltage drop detector.

The voltage detector 322 may be configured to detect the first voltage drop VDR1 occurring in the first switch 311 of the voltage converter 310. The voltage detector 322 may receive voltages across the first switch 311, and may detect a difference between the received voltages as the first voltage drop VDR1. The first voltage drop VDR1 may have a level corresponding to an amount of a load current. The voltage detector 322 may deliver the first voltage drop VDR1 as digital or analog voltage information VI to the logic 323.

The logic 323 may perform a predefined calculation on the voltage information VI. The logic 323 may process the voltage information VI to obtain an accurate (or approximate) amount of the load current. The logic 323 may control an operation or an operation mode of the voltage converter 310 using the amount of the load current. The logic 323 may provide an amount of the load current to an external device, either voluntarily or upon request from the external device.

Figure 11:
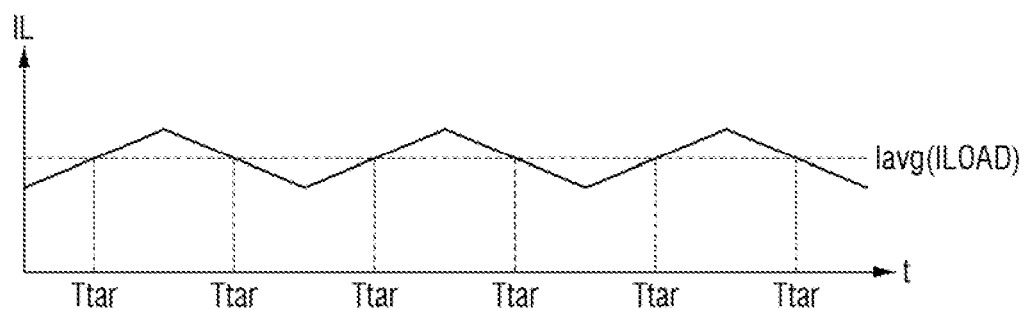
FIG. 11 is a diagram for illustrating change in output current of a voltage converter of FIG. 10.

FIG. 11 is a diagram for illustrating change in an output current of the voltage converter of FIG. 10.

In FIG. 11, a horizontal axis indicates a time t, and a vertical axis indicates a current, e.g., an inductor current IL flowing through the first charging element 315.

Referring to FIG. 10 and FIG. 11, an amount of the inductor current IL may be repeatedly increased and decreased. For example, when the first switch 311 is turned on, the amount of the inductor current IL may increase. When the second switch 312 is turned on, the amount of the inductor current IL may decrease.

When the inductor current IL is repeatedly increased and decreased, an average current Iavg may be a middle value between a maximum value and a minimum value of the inductor current IL. When the amount of the inductor current IL is detected at target timings Ttar at which the inductor current IL meets the middle value, the average current Iavg, that is, the amount of the load current ILOAD, may be obtained.

Figure 12:
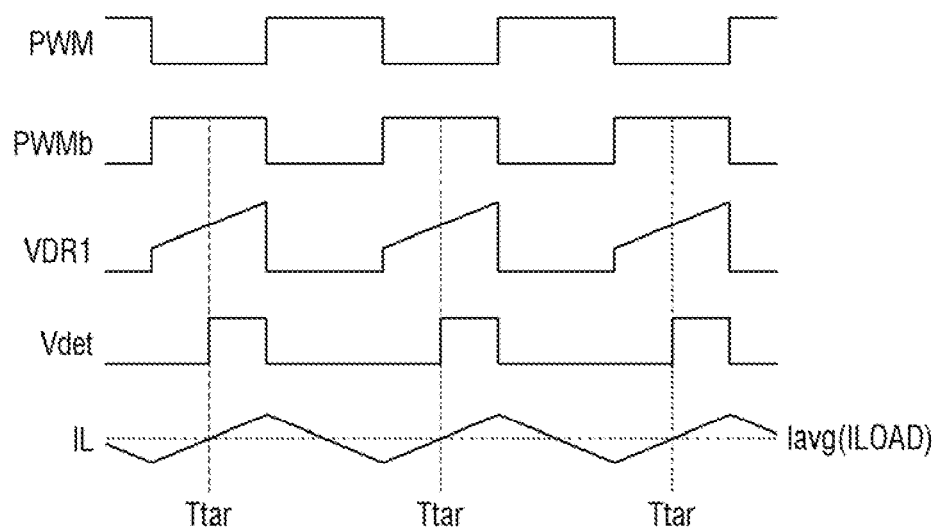
FIG. 12 is a timing diagram for illustrating examples in which a pulse width modulation signal, a first voltage drop, a detected voltage, and an inductor current change.

FIG. 12 is a timing diagram for illustrating examples in which the pulse width modulation signal, the first voltage drop, the detected voltage, and the inductor current change.

Referring to FIG. 10 and FIG. 12, the first switch 311 is turned on when the pulse width modulation signal PWM is at a low level. Accordingly, a duty of an inverted signal PWMb of the pulse width modulation signal PWM may be referenced in association with the first switch 311.

When the inverted signal PWMb is at a high level, the first switch 311 is turned on. When the first switch 311 is turned on, the inductor current IL increases. When a half of a duty of the inverted signal PWMb has elapsed, the inductor current IL has a current amount corresponding to the load current ILOAD. Accordingly, the timing detector 321 may be configured to have the target timing Ttar when the half of the duty of the inverted signal PWMb has elapsed. For example, the first resistor Ra and the second resistor Rb of the voltage divider 120 (see FIG. 2) may be implemented to have the same resistance value.

When the detected voltage Vdet indicates a timing when the half of the duty of the inverted signal PWMb has elapsed, the average current Iavg, that is, the load current ILOAD, may be obtained from the inductor current IL.

In general, a resistor may be inserted into a line through which the current flows, and then a current amount may be obtained by sensing a voltage across the resistor. However, this approach would result in power loss due to current flowing through the resistor. Further, a high-accuracy resistor is called for in order to measure the amount of current at high accuracy, and accordingly, the resistor should be installed outside a semiconductor chip or package, which would result in an increase in an installation area.

According to an example embodiment, as shown in FIG. 10, when the first switch 311 is turned on, the voltage across the first switch 311 is detected, and then an amount of current is calculated using a sensed voltage drop. Accordingly, the power loss and the installation area increase may be prevented.

As shown in FIG. 12, a waveform of the first voltage drop VDR1 rises up in the same manner as a waveform of the inductor current IL rises up. Accordingly, detecting the first voltage drop VDR1 at the target timing Ttar may allow information about the load current ILOAD to be obtained. Detecting the first voltage drop VDR1 may allow the information about the load current ILOAD to be obtained without an additional element and power consumption.

The voltage detector 322 may deliver the voltage information VI of the first voltage drop VDR1 to the logic 323.

The logic 323 may calculate the load current ILOAD from the voltage information VI. For example, when the first switch 311 is turned on, the current is transferred from the power node to the load through the first switch 311 and the first charging element 315. Resistance components of the first switch 311 and the first charging element 315 are mainly due to the first switch 311. Accordingly, the logic 323 divides the voltage information VI indicating the first voltage drop VDR1 by a resistance value of the first switch 311 to obtain a value of the load current ILOAD.

The logic 323 may store therein information about the resistance value of the first switch 311. The logic 323 may store therein information about the resistance value of the first switch 311 including changes in the resistance value according to a temperature. The logic 323 may obtain temperature information from a temperature sensor disposed inside or outside the device 300, and may select the resistance value of the first switch 311 based on the temperature information.

In connection with FIG. 10 to FIG. 12, an example in which the voltage converter 310 uses the pulse width modulation signal generator 318 and the pulse width modulation signal PWM has been described. In an implementation, the pulse width modulation signal generator 318 of the voltage converter 310 may be replaced with a pulse frequency modulation signal (PFM) generator. In an implementation, the pulse width modulation signal generator 318 and the pulse frequency modulation signal (PFM) generator may be included in the voltage converter 310, and may operate selectively. The first switch controller 313, the second switch controller 314, and the timing detector 321 may operate in response to the pulse width modulation signal or the pulse frequency modulation signal.

Figure 13:
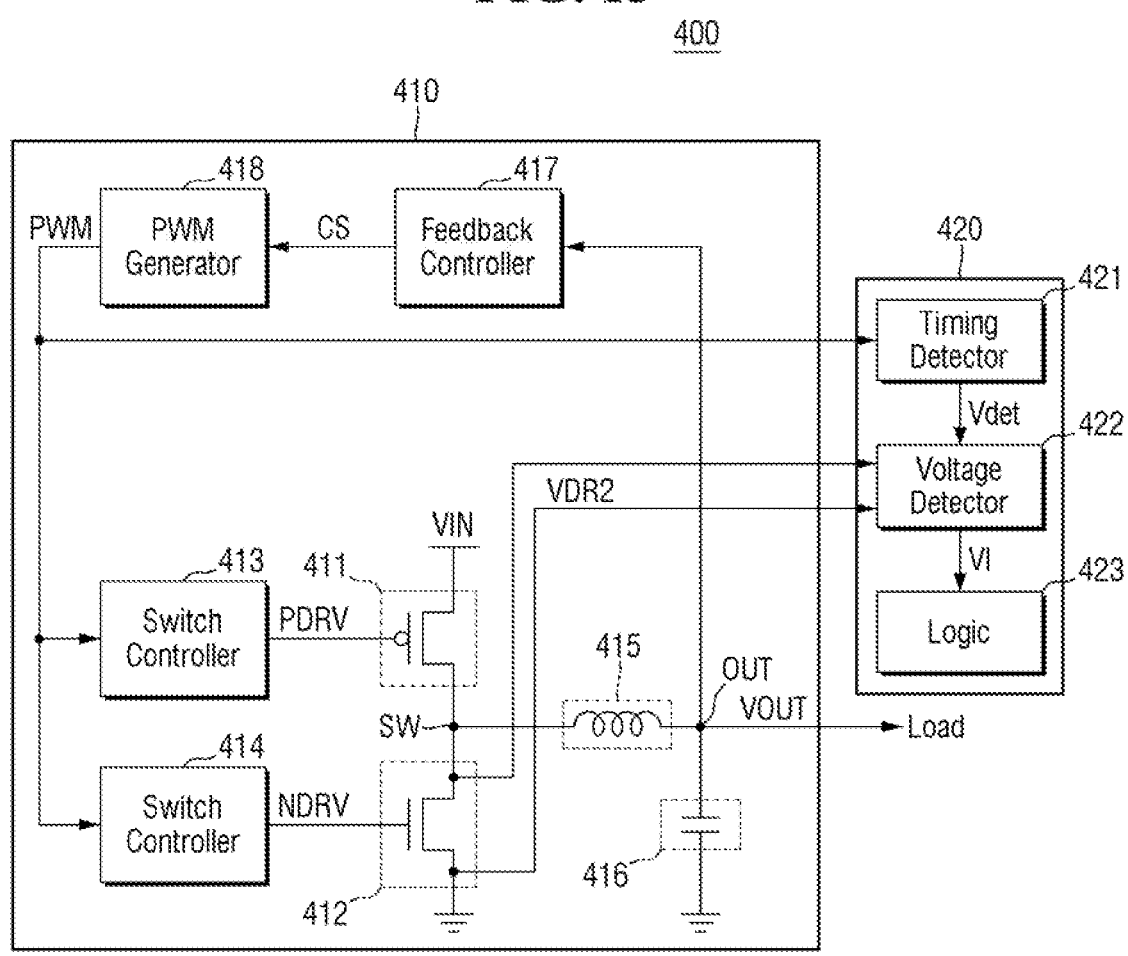
FIG. 13 is a diagram for illustrating a device according to some example embodiments.
Figure 14:
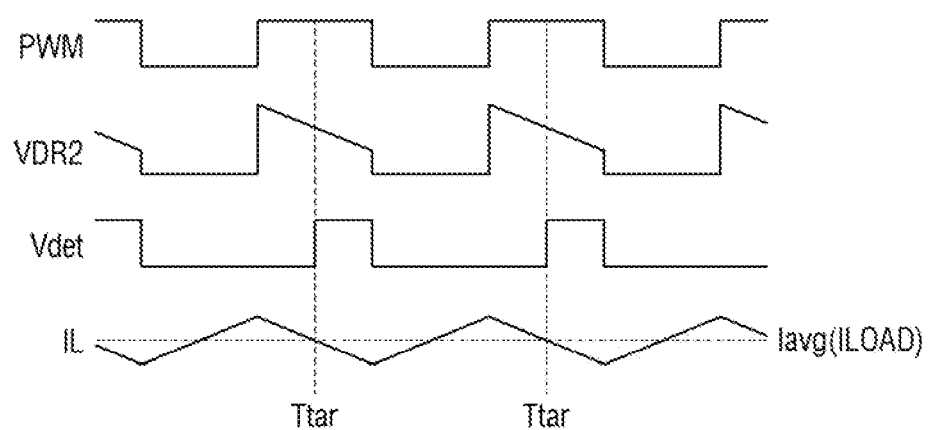
FIG. 14 is a timing diagram for illustrating examples of changes in a pulse width modulation signal, a second voltage drop, a detected voltage, and an inductor current.

FIG. 13 is a diagram for illustrating a device according to some example embodiments. FIG. 14 is a timing diagram for illustrating examples in which the pulse width modulation signal, the second voltage drop, the detected voltage, and the inductor current change.

Referring to FIG. 13, a device 400 may include a voltage converter 410 and a current detector 420.

The voltage converter 410 may include a first switch 411, a second switch 412, a first switch controller 413, a second switch controller 414, a first charging element 415, a second charging element 416, a feedback controller 417, and a pulse width modulation signal generator 418.

The voltage converter 410 may be configured and operate in the same manner as the voltage converter 310 as described above with reference to FIG. 10. Accordingly, redundant description of the voltage converter 410 is omitted.

The current detector 420 may include a timing detector 421, a voltage detector 422, and a logic 423. The current detector 420 may be configured and operates in substantially the same or similar manner as or to the current detector 320 as described above with reference to FIG. 10, except that the voltage detector 422 detects a second voltage drop VDR2 of not the first switch 411 but the second switch 412.

Referring to FIG. 13 and FIG. 14, the second switch 412 is turned on when the pulse width modulation signal PWM is at a high level. Accordingly, a duty of the pulse width modulation signal PWM may be referenced in association with the second switch 412.

When the pulse width modulation signal PWM is at a high level, the second switch 412 is turned on. When the second switch 412 is turned on, the inductor current IL increases. When a half of the pulse width modulation signal PWM duty has elapsed, the inductor current IL has an average current Iavg, e.g., a current amount corresponding to the load current ILOAD. Therefore, the timing detector 421 may be implemented to have a target timing Ttar when the half of the duty of the pulse width modulation signal PWM has elapsed.

When the detected voltage Vdet informs a timing when the half of duty of the pulse width modulation signal PWM has elapsed, the voltage detector 422 may detect the second voltage drop VDR2. As shown in FIG. 14, a waveform of the second voltage drop VDR2 falls in the same manner as a waveform of the inductor current IL falls.

Accordingly, detecting the second voltage drop VDR2 at the target timing Ttar may allow information about the load current ILOAD to be obtained. The voltage detector 422 may deliver the voltage information VI of the second voltage drop VDR2 to the logic 323.

The logic 423 may calculate the load current ILOAD from the voltage information VI. For example, when the second switch 412 is turned on, current is transferred from the ground node to the load through the second switch 412 and the first charging element 415. Resistance components of the second switch 412 and the first charging element 415 are mainly due to the second switch 412. Accordingly, the logic 423 divides the voltage information VI indicating the second voltage drop VDR2 by a resistance value of the second switch 412 to obtain a value of the load current ILOAD.

The logic 423 may store therein information about the resistance value of the second switch 412. The logic 423 may store therein information about the resistance value of the second switch 412 including changes in the resistance value according to a temperature. The logic 423 may obtain temperature information from a temperature sensor disposed inside or outside the device 400, and may select the resistance value of the second switch 412 based on the temperature information.

In FIG. 13 and FIG. 14, an example in which the voltage converter 410 uses the pulse width modulation signal generator 418 and the pulse width modulation signal PWM has been described. In an implementation, the pulse width modulation signal generator 418 of the voltage converter 410 may be replaced with a pulse frequency modulation signal (PFM) generator. In an implementation, the pulse width modulation signal generator 418 and the pulse frequency modulation signal (PFM) generator may be included in the voltage converter 410 and may operate selectively. The first switch controller 413, the second switch controller 414, and the timing detector 421 may operate in response to the pulse width modulation signal or the pulse frequency modulation signal.

Figure 15:
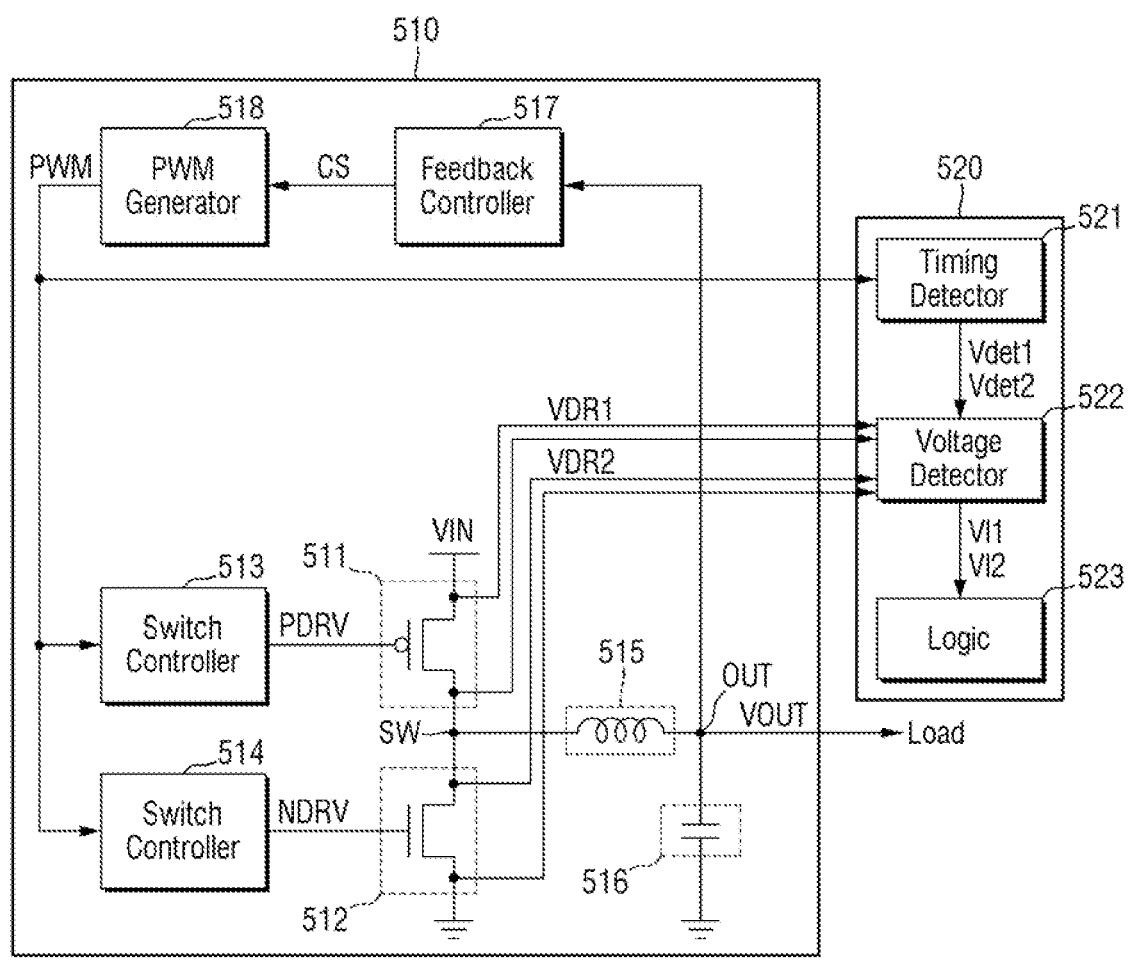
FIG. 15 is a diagram for illustrating a device according to some example embodiments.

FIG. 15 is a diagram for illustrating a device according to some example embodiments.

Referring to FIG. 15, a device 500 may include a voltage converter 510 and a current detector 520.

The voltage converter 510 may include a first switch 511, a second switch 512, a first switch controller 513, a second switch controller 514, a first charging element 515, a second charging element 516, a feedback controller 517, and a pulse width modulation signal generator 518.

The voltage converter 510 may be configured and operate in the same manner as the voltage converter 310 or 410 as described above with reference to FIG. 10 or FIG. 13. Accordingly, redundant description of the voltage converter 510 is omitted.

The current detector 520 may include a timing detector 521, a voltage detector 522, and a logic 523. As described above with reference to FIG. 10 and FIG. 12, the timing detector 521 may transition a first detected voltage Vdet1 to a high level when a half of a duty of an inverted signal PWMb (FIG. 16) of a pulse width modulation signal PWM has elapsed.

As described above with reference to FIG. 1 and FIG. 14, the timing detector 521 may transition a second detected voltage Vdet2 to a high level when the half of the duty of the inverted signal PWMb (FIG. 16) of the pulse width modulation signal PWM has elapsed.

The timing detector 521 may include a first block configured to generate the first detected voltage Vdet1 from the inverted signal PWMb, and a second block configured to generate the second detected voltage Vdet2 from the pulse width modulation signal PWM.

As described above with reference to FIG. 10 and FIG. 12, the voltage detector 522 may detect the first voltage drop VDR1 from the first switch 511 in response to the first detected voltage Vdet1. The first voltage information VI1 of the first voltage drop VDR1 may be transferred to the logic 523.

As described above with reference to FIG. 13 and FIG. 14, the voltage detector 522 may detect the second voltage drop VDR2 from the second switch 512 in response to the second detected voltage Vdet2. The second voltage information VI2 of the second voltage drop VDR2 may be transferred to the logic 523.

As described above with reference to FIG. 10 and FIG. 12, the logic 523 may calculate the load current ILOAD (FIG. 16) using a resistance value of the first switch 511 and the first voltage information VI1. As described above with reference to FIG. 13 and FIG. 14, the logic 523 may calculate the load current ILOAD using a resistance value of the second switch 512 and the second voltage information VI2.

Figure 16:
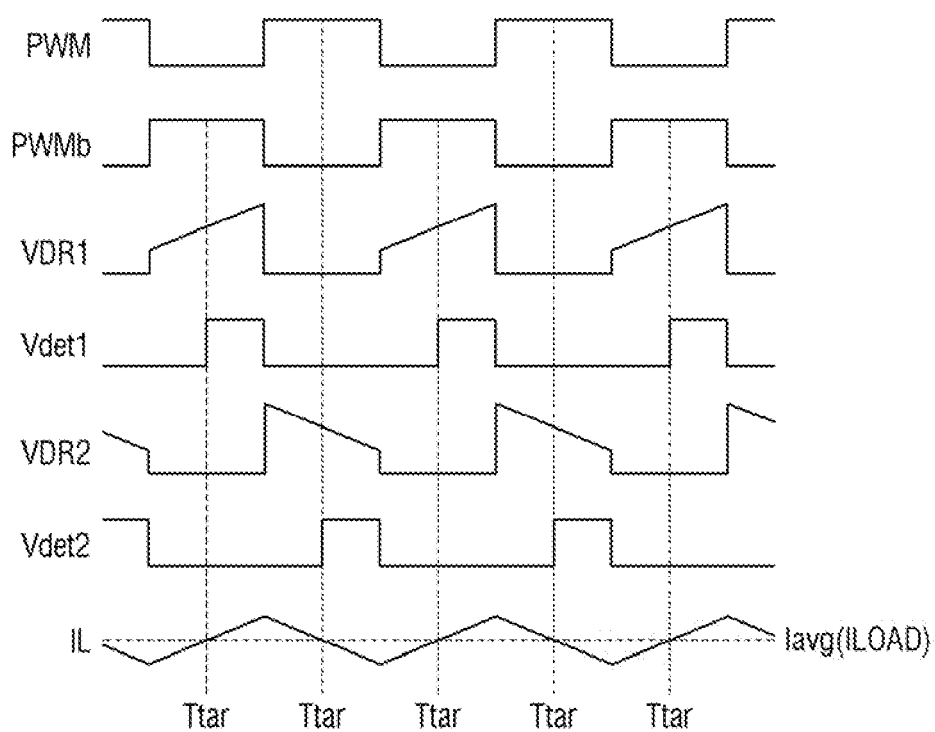
FIG. 16 is a timing diagram for illustrating examples in which a pulse width modulation signal, a first voltage drop, a second voltage drop, a detected voltage, and an inductor current change.

FIG. 16 shows examples of changes in the pulse width modulation signal PWM, the first voltage drop VDR1, the second voltage drop VDR2, the detected voltage Vdet, and the inductor current IL.

Referring to FIG. 15 and FIG. 16, the timing detector 521 may set the first detected voltage Vdet1 to a high level when the half of the duty of the inverted signal PWMb of the pulse width modulation signal PWM has elapsed, as described above with reference to FIG. 12. Further, as described above with reference to FIG. 14, the timing detector 521 may transition the second detected voltage Vdet2 to a high level when a half of the duty of the pulse width modulation signal PWM has elapsed.

As described above with reference to FIG. 12, the voltage detector 522 may detect the first voltage drop VDR1 in response to the first detected voltage Vdet1. As described above with reference to FIG. 14, the voltage detector 522 may detect the second voltage drop VDR2 in response to the second detected voltage Vdet2. The voltage detector 522 may transmit the detected first voltage drop VDR1 and the detected second voltage drop VDR2 as the voltage information VI to the logic 523.

As described above with reference to FIG. 12, the logic 523 may calculate the load current ILOAD from the first voltage information VI1 corresponding to the first voltage drop VDR1 and the resistance value of the first switch 511. As described above with reference to FIG. 18, the logic 523 may calculate the load current ILOAD from the second voltage information VI2 corresponding to the second voltage drop VDR2 and the resistance value of the second switch 512.

In FIG. 15 and FIG. 16, an example in which the voltage converter 510 uses the pulse width modulation signal generator 518 and the pulse width modulation signal PWM has been described. In an implementation, the pulse width modulation signal generator 518 of the voltage converter 510 may be replaced with a pulse frequency modulation signal (PFM) generator. In an implementation, the pulse width modulation signal generator 518 and the pulse frequency modulation signal (PFM) generator may be included in the voltage converter 510 and may operate selectively. The first switch controller 513, the second switch controller 514, and the timing detector 521 may operate in response to the pulse width modulation signal or the pulse frequency modulation signal.

Figure 17:
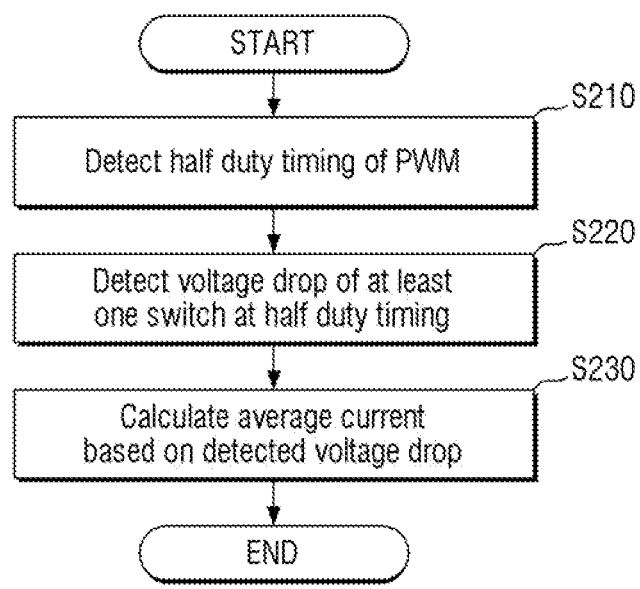
FIG. 17 is a flowchart for illustrating a method of operating a device according to an example embodiment.

FIG. 17 is a flowchart showing a method of operating the device 300, 400, or 500 according to an example embodiment.

Referring to FIG. 10, FIG. 13, FIG. 15 and FIG. 17, in operation S210, the timing detector 321, 421 or 521 of the current detector 320, 420 or 520 of the device 300, 400 or 500 may detect a half duty timing of the pulse width modulation signal PWM (or the inverted signal PWMb).

In operation S220, the voltage detector 322, 422 or 522 of the current detector 320, 420 or 520 of the device 300, 400 or 500 may detect the voltage drop VDR1 or VDR2 of at least one switch 311 or 312, 411 or 412, or 511 or 512 of the voltage converter 310, 410 or 510 at the half duty timing.

In operation S230, the logic 323, 423, or 523 of the current detector 320, 420, or 520 of the device 300, 400, or 500 may calculate the load current based on the detected voltage drop VDR1 or VDR2.

Figure 18:
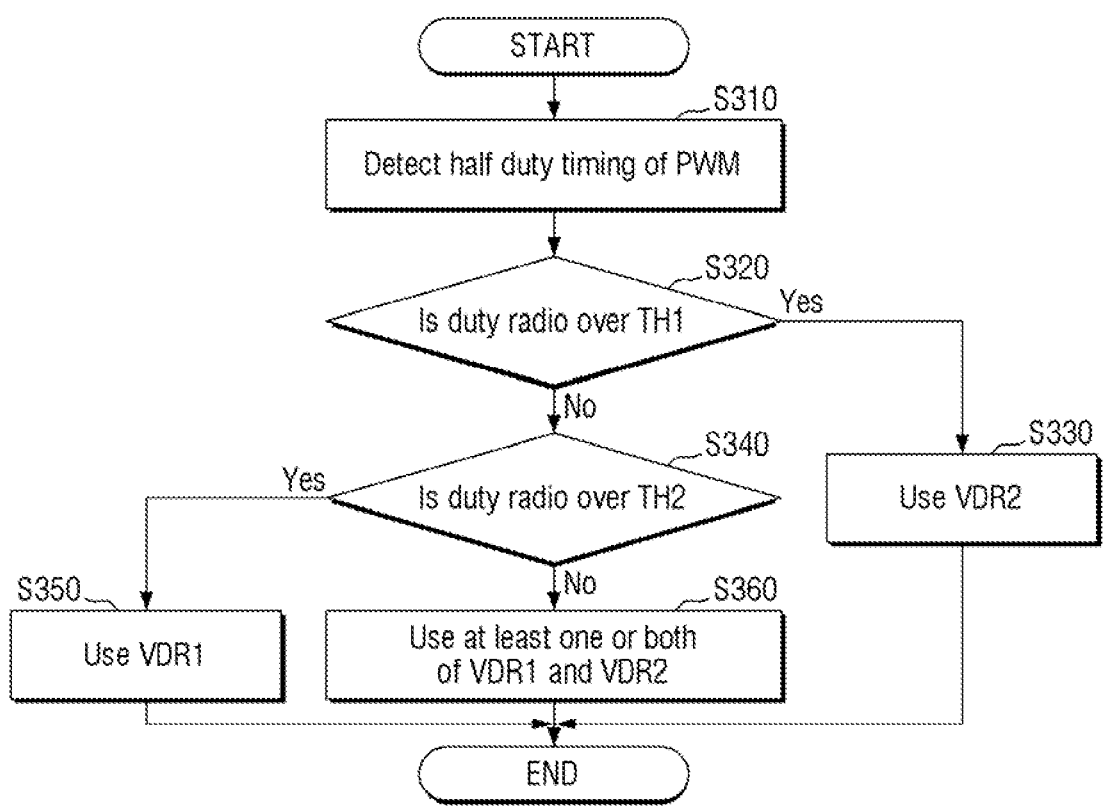
FIG. 18 is a flowchart for illustrating another example of a method of operating a device according to an example embodiment.

FIG. 18 is a flowchart showing another example of a method of operating the device 300, 400, or 500 according to an example embodiment.

Referring to FIG. 10, FIG. 13, FIG. 15 and FIG. 18, in operation S310, the current detector 320, 420 or 520 of the device 300, 400 or 500 may detect the duty ratio of the pulse width modulation signal PWM.

In operation S320, the current detector 320, 420 or 520 of the device 300, 400 or 500 may determine whether the duty ratio is greater than a first threshold TH1. When the duty ratio is greater than the first threshold TH1, the current detector 320, 420 or 520 of the device 300, 400, or 500 may perform current detection using the second voltage drop VDR2 in operation S330.

When the duty ratio is equal to or smaller than the first threshold TH1, the current detector 320, 420 or 520 of the device 300, 400, or 500 may determine whether the duty ratio is smaller than a second threshold TH2 in operation S340. The second threshold TH2 may be smaller than the first threshold TH1. When the duty ratio is smaller than the second threshold TH2, the current detector 320, 420 or 520 of the device 300, 400, or 500 may perform current detection using the first voltage drop VDR1 in operation S350.

When the duty ratio is greater than or equal to the second threshold TH2, the current detector 320, 420 or 520 of the device 300, 400 or 500 may perform current detection using at least one or both of the first voltage drop VDR1 and the second voltage drop VDR2 in operation S360.

When the duty ratio of the pulse width modulation signal PWM is greater than the first threshold TH1, it may be more stable and easier to generate the detected voltage Vdet from the duty of the pulse width modulation signal PWM using the second voltage drop VDR2. When the duty ratio of the pulse width modulation signal PWM is smaller than the second threshold TH2, it may be more stable and easier to generate the detected voltage Vdet from the duty of the inverted signal PWMb of the pulse width modulation signal PWM using the first voltage drop VDR1.

Figure 19:
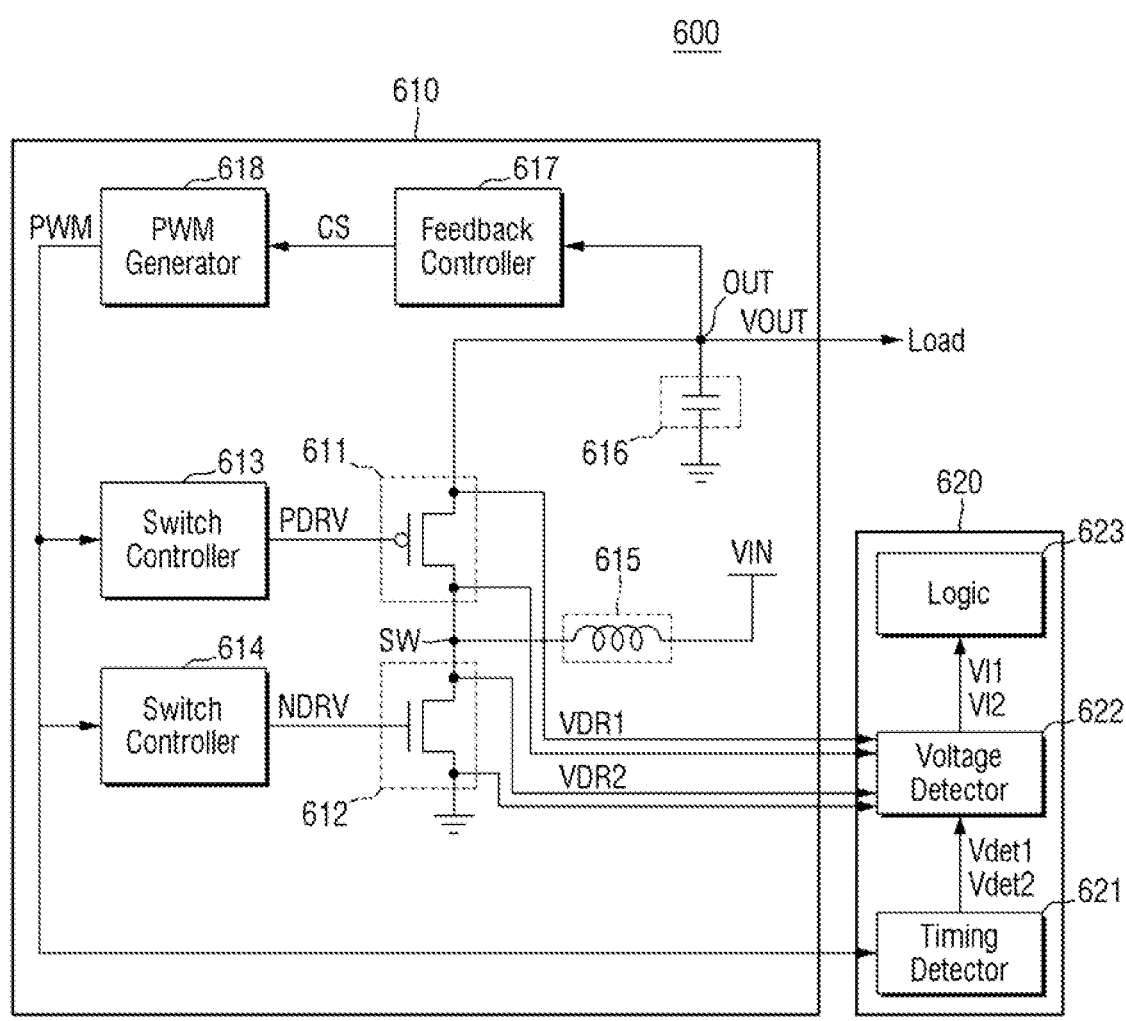
FIG. 19 is a diagram for illustrating a device according to some example embodiments.

FIG. 19 is a diagram for illustrating a device according to some example embodiments.

A device 600 may be a power management device or a power management integrated circuit (PMIC).

Referring to FIG. 19, the device 600 may include a voltage converter 610 and a current detector 620.

The voltage converter 610 may be embodied as a DC-DC converter. Further, the voltage converter 610 may be embodied as a boost converter that generates the output voltage VOUT higher than the input voltage VIN.

The voltage converter 610 may include a first switch 611, a second switch 612, a first switch controller 613, a second switch controller 614, a first charging element 615, a second charging element 616, a feedback controller 617, and a pulse width modulation signal generator 618.

The first switch 611 may be connected to and disposed between the switch node SW and the output node OUT (to which the output voltage VOUT is supplied). The first switch 611 may operate in response to a first control signal PDRV output from the first switch controller 613. The first switch 611 may be embodied as a PMOS transistor, e.g., a first transistor.

The second switch 612 may be connected to and disposed between the switch node SW and the ground node. The second switch 612 may operate in response to a second control signal NDRV output from the second switch controller 614. The second switch 612 may be embodied as an NMOS transistor, e.g., a second transistor.

The first switch controller 613 and the second switch controller 614 may output the first control signal PDRV and the second control signal NDRV, respectively, in response to the pulse width modulation signal PWM as described above with reference to FIG. 10 to FIG. 18.

The first charging element 615 may be connected to and disposed between the input node (to which the input voltage VIN is supplied) and the switch node SW. The first charging element 615 may be embodied as an inductor.

The second charging element 616 may be connected to and disposed between the output node OUT and the ground node. The second charging element 616 may be embodied as a capacitor.

As described above with reference to FIG. 10 to FIG. 19, the feedback controller 617 may control the pulse width modulation signal generator 618 based on the control signal CS so that the output voltage VOUT is maintained at a target level.

The current detector 620 may include a timing detector 621, a voltage detector 622, and a logic 623. The current detector 620 may be configured and operate in the same manner as described above with reference to FIG. 15 and FIG. 16. The current detector 620 may calculate the load current of the voltage converter 610.

As described above with reference to FIG. 10 to FIG. 12, the voltage detector 622 of the device 600 may detect the first voltage drop VDR1 from the first switch 611, and may use the detected first voltage drop VDR1. As described above with reference to FIG. 13 and FIG. 14, the voltage detector 622 of the device 600 may detect the second voltage drop VDR2 from the second switch 612, and may use the detected second voltage drop VDR2.

By way of summation and review, a device using the toggle signal as an operation control signal may be a DC-DC converter. The DC-DC converter may be configured to boost or reduce an input voltage, and to output the boosted or reduced voltage. The DC-DC converter may control an amount of output current using the toggle signal, based on an amount of current consumed by a load. When the toggle signal is used as an operation control signal, detecting whether a current timing of the toggle signal is a target timing is helpful in observing a state of the device that receives or uses the toggle signal.

As described above, embodiments may provide a duty timing detector that includes a feedback structure and thus accurately detects a duty timing of a toggle signal without offset or mismatch. Embodiments may provide a device including a duty timing detector that includes a feedback structure and thus accurately detects a duty timing of a toggle signal without offset or mismatch. Embodiments may provide a method of operating a toggle signal receiving device including a duty timing detector that includes a feedback structure and thus accurately detects a duty timing of a toggle signal without offset or mismatch.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A duty timing detector, comprising:
   a control logic, the control logic being configured to:
      receive an input toggle signal and an output toggle signal that corresponds to the input toggle signal, wherein the input toggle signal repeatedly transitions between a high level and a low level, and
      generate a difference signal using a difference between a duty of the input toggle signal and a duty of the output toggle signal;
   a first low-pass filter configured to output a DC input voltage based on a pulse width of the input toggle signal;
   a second low-pass filter configured to output a DC difference voltage based on a pulse width of the difference signal;
   a compensation circuit configured to compensate the duty of the output toggle signal using the DC input voltage and the DC difference voltage; and
   an oscillator configured to generate a duty-compensated output toggle signal, and to provide the duty-compensated output toggle signal to the control logic.

2. The duty timing detector as claimed in claim 1, wherein:
   the duty timing detector further includes a voltage divider configured to divide the DC input voltage based on a predefined ratio, and to output a DC divided voltage, and
   the compensation circuit is configured to compensate the duty of the output toggle signal based on the predefined ratio.

3. The duty timing detector as claimed in claim 2, wherein:
   the voltage divider includes a first resistor and a second resistor connected in series with each other, and the predefined ratio is calculated based on the following Equation 1:

$$\alpha = Rb/(Ra+Rb) \quad \text{Equation 1}$$

wherein in the Equation 1, α denotes the predefined ratio, Ra denotes a resistance value of the first resistor, and Rb denotes a resistance value of the second resistor.

4. The duty timing detector as claimed in claim 1, wherein the control logic includes a latch configured to generate the difference signal indicating an interval between edges of the input toggle signal and the output toggle signal.

5. The duty timing detector as claimed in claim 4, wherein the latch includes an SR latch.

6. The duty timing detector as claimed in claim 1, wherein:
the oscillator includes:
a sawtooth-wave voltage generator configured to output a sawtooth-wave voltage in synchronization with the input toggle signal; and
a comparator configured to receive the sawtooth-wave voltage, and to receive a compensation voltage from the compensation circuit,
the compensation voltage is generated using the DC input voltage and the DC difference voltage, and
the comparator is configured to compare a magnitude of the sawtooth-wave voltage with a magnitude of the compensation voltage, and to output the output toggle signal based on the comparison.

7. The duty timing detector as claimed in claim 6, wherein:
the sawtooth-wave voltage generator includes:
a current source connected to a power node, to which a power voltage is supplied;
a capacitor connected to and disposed between the current source and a ground node, to which a ground voltage is supplied; and
a transistor disposed between and connected to the current source and the ground node, and connected in parallel with the capacitor,
the transistor is configured to be turned on as a level of the input toggle signal transitions from the high level to the low level, and is configured to turned off as the level of the input toggle signal transitions from the low level to the high level, and
a voltage between the current source and the capacitor is output as the sawtooth-wave voltage.

8. The duty timing detector as claimed in claim 1, wherein the compensation circuit includes an amplifier circuit in a form of an inverting integrator.

9. The duty timing detector as claimed in claim 8, wherein the compensation circuit further includes a chopper configured to determine a polarity input to the amplifier circuit.

10. A duty timing detector, comprising:
a first low-pass filter configured to receive an input toggle signal and output a DC input voltage based on a pulse width of the input toggle signal, wherein the input toggle signal repeatedly transitions between a high level and a low level;
a voltage divider configured to divide the DC input voltage based on a predefined ratio, and to output a DC divided voltage;
a latch configured to receive the input toggle signal and an output toggle signal that corresponds to the input toggle signal, and to generate a difference signal indicating an interval between edges of the input toggle signal and the output toggle signal;
a compensation circuit configured to compensate a duty of the output toggle signal, based on the DC divided voltage and the difference signal; and
an oscillator configured to generate a duty-compensated output toggle signal and provide the duty-compensated output toggle signal as the output signal that is input to the latch.

11. The duty timing detector as claimed in claim 10, further comprising a second low-pass filter configured to output a DC difference voltage based on the pulse width of the difference signal,
wherein the compensation circuit is configured to compensate the duty of the output toggle signal using the DC divided voltage and the DC difference voltage.

12. The duty timing detector as claimed in claim 10, wherein the latch includes an SR latch.

13. The duty timing detector as claimed in claim 10, wherein:
the voltage divider includes a first resistor and a second resistor connected in series with each other, and
the predefined ratio is calculated based on the following Equation 1:

$$\alpha = Rb/(Ra+Rb) \quad \text{Equation 1}$$

wherein in the Equation 1, α denotes the predefined ratio, Ra denotes a resistance value of the first resistor, and Rb denotes a resistance value of the second resistor.

14. The duty timing detector as claimed in claim 13, wherein the compensation circuit is configured to compensate the duty of the output toggle signal based on the predefined ratio.

15. The duty timing detector as claimed in claim 10, wherein the compensation circuit includes an amplifier circuit in a form of an inverting integrator.

16. A device, comprising:
a voltage converter configured to convert a first voltage into a second voltage using an input toggle signal, and to output the second voltage to a load, wherein the input toggle signal repeatedly transitions between a high level and a low level; and
a current detector configured to detect an output toggle signal at a timing when a half of each duty of the input toggle signal has elapsed, and to detect a load current transmitted from the voltage converter to the load,
wherein the current detector includes:
a control logic configured to receive the input toggle signal and the output toggle signal, and to generate a difference signal using a difference between a duty of the input toggle signal and a duty of the output toggle signal;
a first low-pass filter configured to output a DC input voltage based on a pulse width of the input toggle signal;
a second low-pass filter configured to output a DC difference voltage based on a pulse width of the difference signal;
a compensation circuit configured to compensate the duty of the output toggle signal using the DC input voltage and the DC difference voltage; and
an oscillator configured to generate a duty-compensated output toggle signal, and to provide the duty-compensated output toggle signal to the control logic.

17. The device as claimed in claim 16, wherein the current detector further includes:
a voltage drop detector configured to detect an internal voltage drop of the voltage converter in response to the output toggle signal; and a logic configured to perform a calculation on the internal voltage drop detected by the voltage drop detector, and to detect the load current based on the calculation.

18. The device as claimed in claim 16, wherein the voltage converter includes:
- a first transistor and a second transistor connected in series with each other, and disposed between and connected to a node to which the first voltage is input and a ground node to which a ground voltage is supplied;
- an inductor connected to and disposed between a node between the first transistor and the second transistor and an output node from which the second voltage is output; and
- a capacitor connected to and disposed between the output node and the ground node,
- wherein the first transistor is configured to be turned on when the input toggle signal is at the low level,
- wherein the second transistor is configured to be turned on when the input toggle signal is at the high level.

19. The device as claimed in claim 16, wherein:
the device further comprises a voltage divider configured to divide the DC input voltage based on a predefined ratio to output a DC divided voltage, and
the compensation circuit is configured to compensate the duty of the output toggle signal based on the predefined ratio.

20. The device as claimed in claim 16, wherein the control logic includes a latch configured to generate the difference signal indicating an interval between edges of the input toggle signal and the output toggle signal.

* * * * *